(12) United States Patent
Chen et al.

(10) Patent No.: US 11,139,374 B2
(45) Date of Patent: Oct. 5, 2021

(54) FIELD-EFFECT TRANSISTORS WITH SEMICONDUCTING GATE

(71) Applicant: The Hong Kong University of Science And Technology, Kowloon (HK)

(72) Inventors: Jing Chen, Kowloon (HK); Qingkai Qian, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 16/536,412

(22) Filed: Aug. 9, 2019

(65) Prior Publication Data

US 2020/0052071 A1 Feb. 13, 2020

Related U.S. Application Data

(60) Provisional application No. 62/764,619, filed on Aug. 13, 2018.

(51) Int. Cl.
*H01L 29/10* (2006.01)
*H01L 29/423* (2006.01)
*H01L 29/08* (2006.01)

(52) U.S. Cl.
CPC ...... *H01L 29/1033* (2013.01); *H01L 29/0847* (2013.01); *H01L 29/42372* (2013.01)

(58) Field of Classification Search
CPC .......... H01L 29/1033; H01L 29/42372; H01L 29/0847; H01L 51/0512; H01L 29/42316; H01L 29/0657; H01L 29/413; H01L 29/78618; H01L 29/78684; H01L 29/78681; H01L 29/78654; H01L 29/7869; H01L 29/4908; H01L 29/42384; H01L 29/435; H01L 29/4966; H01L 29/66462; H01L 29/4236; H01L 29/49; H01L 29/4916; H01L 29/7786; H01L 29/432;

(Continued)

(56) References Cited

U.S. PATENT DOCUMENTS 3,407,339 A 10/1968 Booher
3,712,995 A 1/1973 Steudel
4,066,918 A 1/1978 Heuner et al.
(Continued)

OTHER PUBLICATIONS

Wang et al., "A dildt Feedback-Based Active Gate Driver for Smart Switching and Fast Overcurrent Protection of IGBT Modules", IEEE Transactions on Power Electronics, vol. 29, No. 7, Jul. 2014, pp. 3720-3732.

(Continued)

*Primary Examiner* — Victor A Mandala
(74) *Attorney, Agent, or Firm* — Amin, Turocy & Watson, LLP

(57) ABSTRACT

Field-effect transistors (FETs) are described that comprise a semiconducting gate (SG) layer, referred to herein as SG-FETs. In one or more embodiments, the FETs can include a channel layer and a SG layer capacitively coupled to the channel layer. The SG layer has an embedded voltage-clamping function that provides internal gate over voltage protection without an additional protection circuit. The embedded voltage-clamping function is based on the SG layer having a maximum effective gate voltage that is clamped to the depletion threshold of the SG layer.

20 Claims, 18 Drawing Sheets

(58) Field of Classification Search
CPC ..... H01L 29/22; H01L 29/24; H01L 51/0048; H01L 29/78; H01L 29/2003
See application file for complete search history.

(56) References Cited

U.S. PATENT DOCUMENTS

| | | | | |
|---|---|---|---|---|
| 4,364,072 | A | * | 12/1982 | Nishizawa .......... H01L 29/1025 257/136 |
| 4,583,105 | A | * | 4/1986 | Rosenberg ............ H01L 29/267 257/192 |
| 4,965,645 | A | * | 10/1990 | Solomon ............... H01L 29/432 257/192 |
| 6,175,394 | B1 | | 1/2001 | Wu et al. |
| 6,864,537 | B1 | * | 3/2005 | Mallikarjunaswamy .................. H01L 29/49 257/355 |
| 7,307,319 | B1 | * | 12/2007 | Chong ................ H01L 27/0255 257/355 |
| 9,160,326 | B2 | | 10/2015 | Chen et al. |
| 9,735,147 | B2 | * | 8/2017 | Mikolajczak ....... H01L 29/4236 |
| 9,882,553 | B2 | | 1/2018 | Kwan et al. |
| 10,388,864 | B2 | * | 8/2019 | Karda .................. H01L 29/267 |
| 2002/0064946 | A1 | * | 5/2002 | Wasshuber ........ H01L 21/28097 438/655 |
| 2007/0238276 | A1 | * | 10/2007 | Liu ................... H01L 21/28035 438/592 |
| 2013/0175613 | A1 | | 7/2013 | Ito et al. |
| 2017/0373247 | A1 | * | 12/2017 | Karda ............... H01L 29/66969 |
| 2019/0367482 | A1 | * | 12/2019 | Liu ...................... C07D 413/12 |

OTHER PUBLICATIONS

Kwan et al., "A Gate Overdrive Protection Technique for Improved Reliability in AlGaN/GaN Enhancement-Mode HEMTs", IEEE Electron Device Letters, vol. 34, No. 1, Jan. 2013, pp. 30-32.
Wu et al., "Power-law Voltage Acceleration: A key Element for Ultra-Thin Gate Oxide Reliability", IBM System and Technology Group, Essex Junction, Mar. 14, 2005, pp. 1809-1834.
Lelis et al., "Time Dependence of Bias-Stress-Induced SiC MOSFET Threshold-Voltage Instability Measurements", IEEE Transactions on Electron Devices, vol. 55, No. 8, Aug. 8, 2008, pp. 1835-1840.
"Types of Electrical Overstress Protection", AND9009/D, Jun. 2014, 11 pages.
Linder et al., "Voltage Dependence of Hard Breakdown Growth and the Reliability Implication in Thin Dielectrics", IEEE Electron Device Letters, vol. 23, No. 11, Nov. 2002, pp. 661-663.
Huang et al., "Evaluation and Application of 600 V GaN HEMT in Cascode Structure", IEEE Transactions on Power Electronics, vol. 29, No. 5, May 2014, pp. 2453-2461.
Chen et al., "GaN-on-Si Power Technology: Devices and Applications", IEEE Transactions on Electron Devices, vol. 64, No. 3, Mar. 2017, pp. 779-795.
Hamada et al., "SiC—Emerging Power Device Technology for Next-Generation Electrically Powered Environmentally Friendly Vehicles", IEEE Transactions on Electron Devices, vol. 62, No. 2, Feb. 2015, pp. 278-285.
Ma et al., "ON-state Critical Gate Overdrive Voltage for Fluorine-Implanted Enhancement-Mode AlGaN/GaN High Electron Mobility Transistors", Journal of Applied Physics, vol. 110, 114514, 2011, 8 pages.
Chen et al., "Investigation of the Gate-Driven Effect and Substrate-Triggered Effect on ESD Robustness of CMOS Devices", IEEE Transactions on Device and Materials Reliability, vol. 1, No. 4, Dec. 2002, pp. 190-203.
Kwan et al., "Integrated Gate-protected HEMTs and Mixed-Signal Functional Blocks for GaN Smart Power Ics", Dept. of Electronic and Computer Engineering, 2012, 4 pages.
Sze, S. M. & Kwok, K. N. Physics of Semiconductor Devices (Wiley-Interscience, 2007).
Efficient Power Conversion, "EPC2025 datasheet", Retrieved Nov. 6, 2019, 6 pages.
GaN Systems, "GS66504B datasheet", Retrieved Nov. 6, 2019, 12 pages.
Panasonic, "PGA26E19BA datasheet", Retrieved Nov. 6, 2019, 3 pages.
ON Semiconductor, "Types of Electrical Overstress Protection", Semiconductor Components Industries, LLC, 2014, 11 pages.
Lagger, P. et al. | "Towards understanding the origin of threshold voltage instability of AlGaN/GaN MIS-HEMTs," 2012 International Electron Devices Meeting, 2012, doi: 10.1109/IEDM.2012. 6479033, 4 pages.
Carter, R. et al. | "22nm FDSOI technology for emerging mobile, Internet-of-Things, and RF applications," 2016 IEEE International Electron Devices Meeting (IEDM), 2016, doi: 10.1109/IEDM.2016. 7838029, 4 pages.
Ma et al. | "Reliability of enhancement-mode AlGaN/GaN HEMTs under ON-state gate overdrive," 2010 International Electron Devices Meeting, 2010, doi: 10.1109/IEDM.2010.5703399, 4 pages.

* cited by examiner

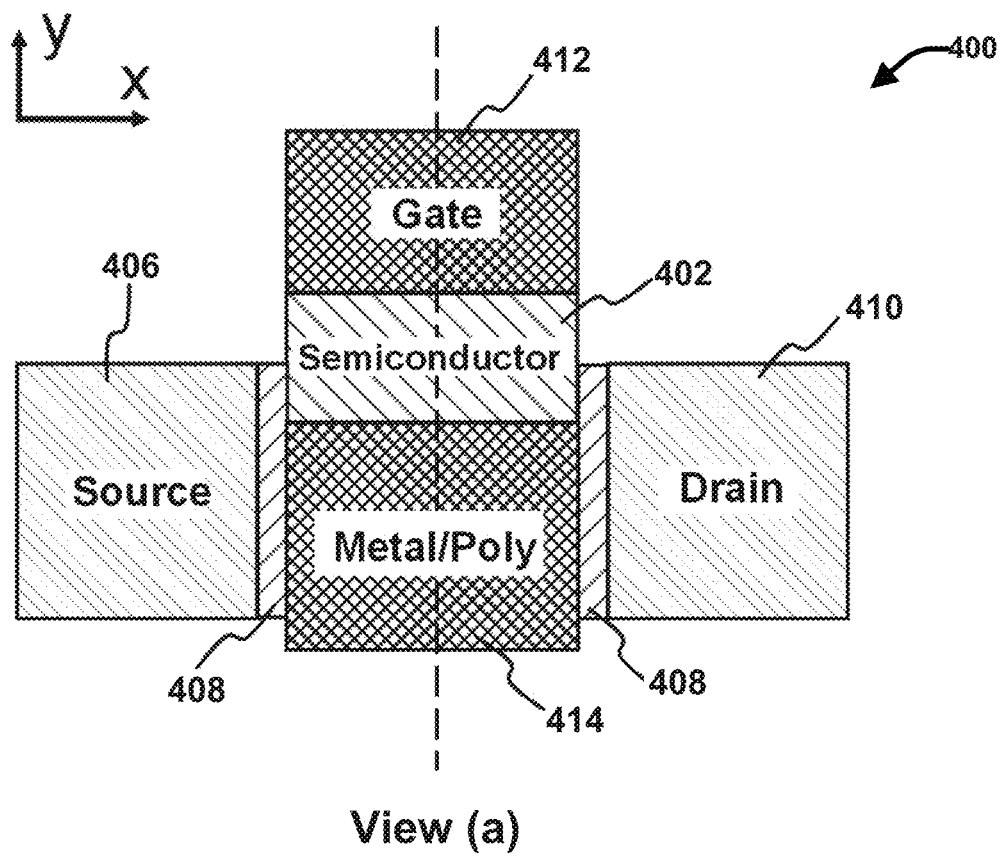
FIG. 4

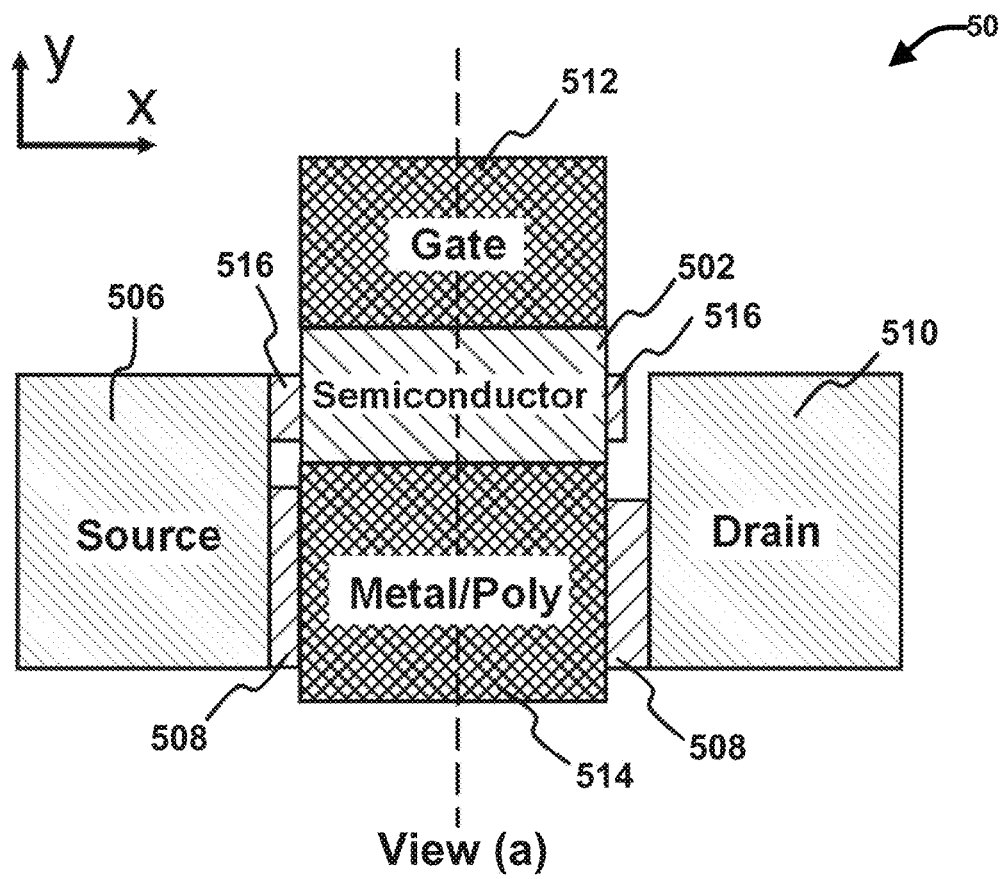
View (a)
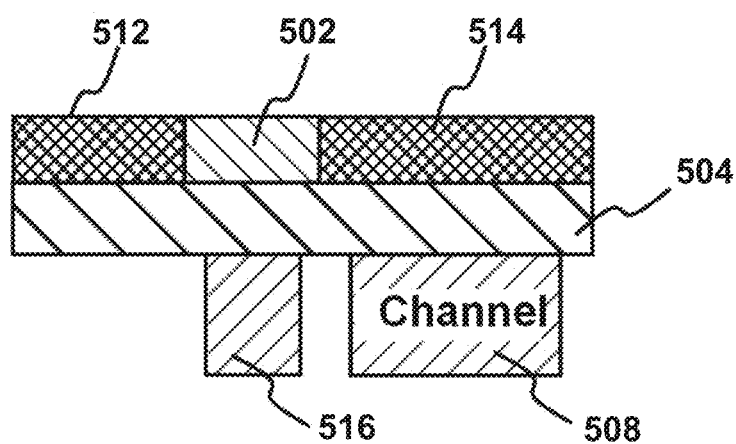
View (b)
FIG. 5

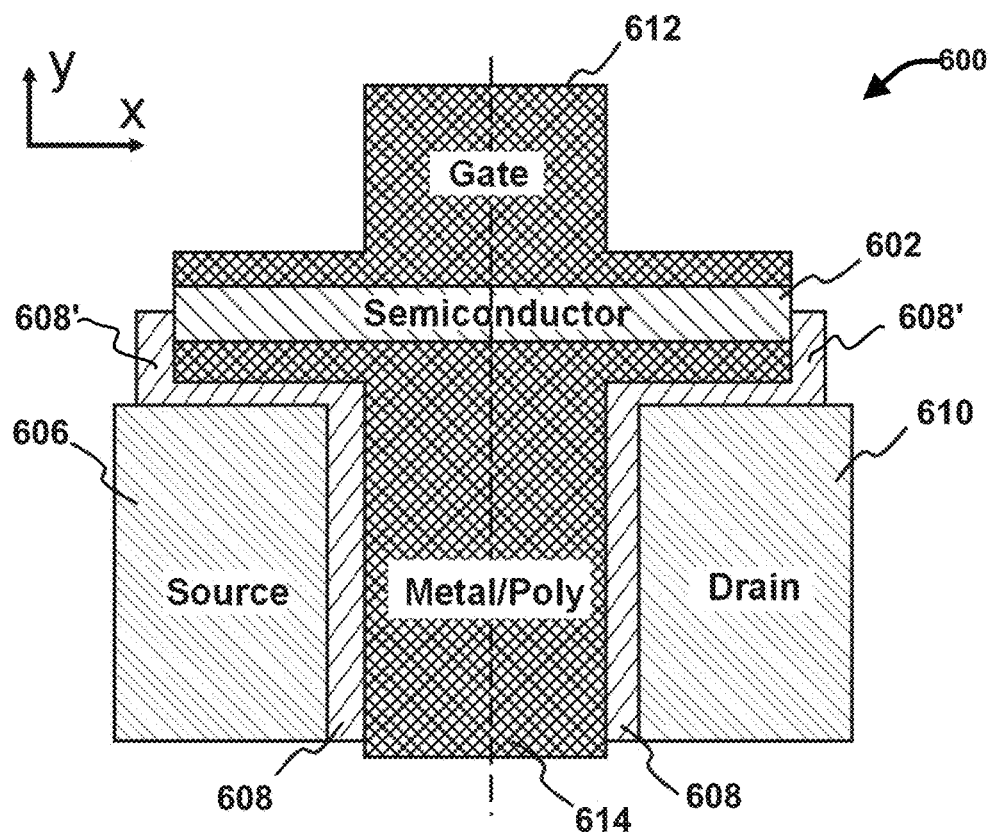
View (a)
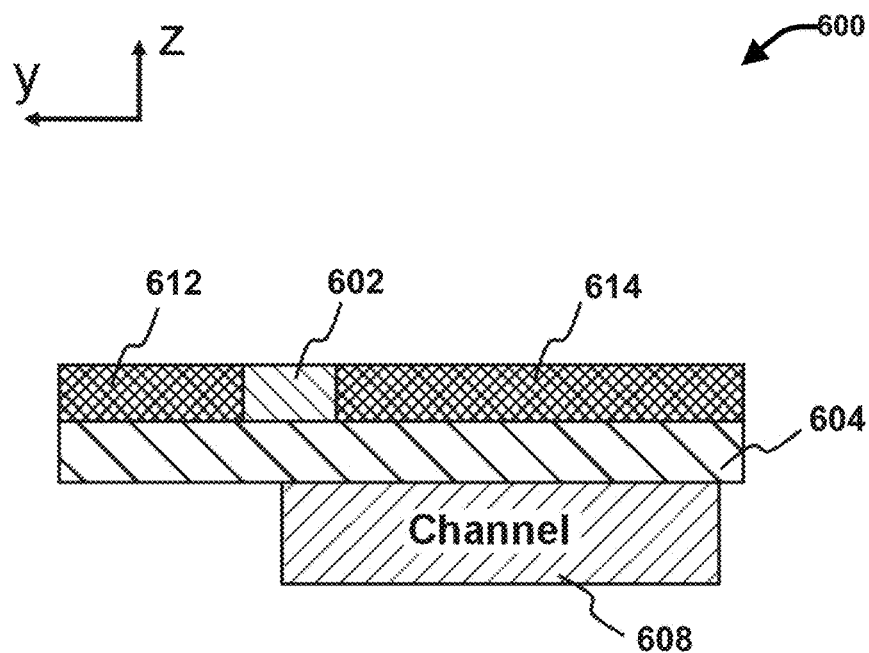
View (b)
FIG. 6

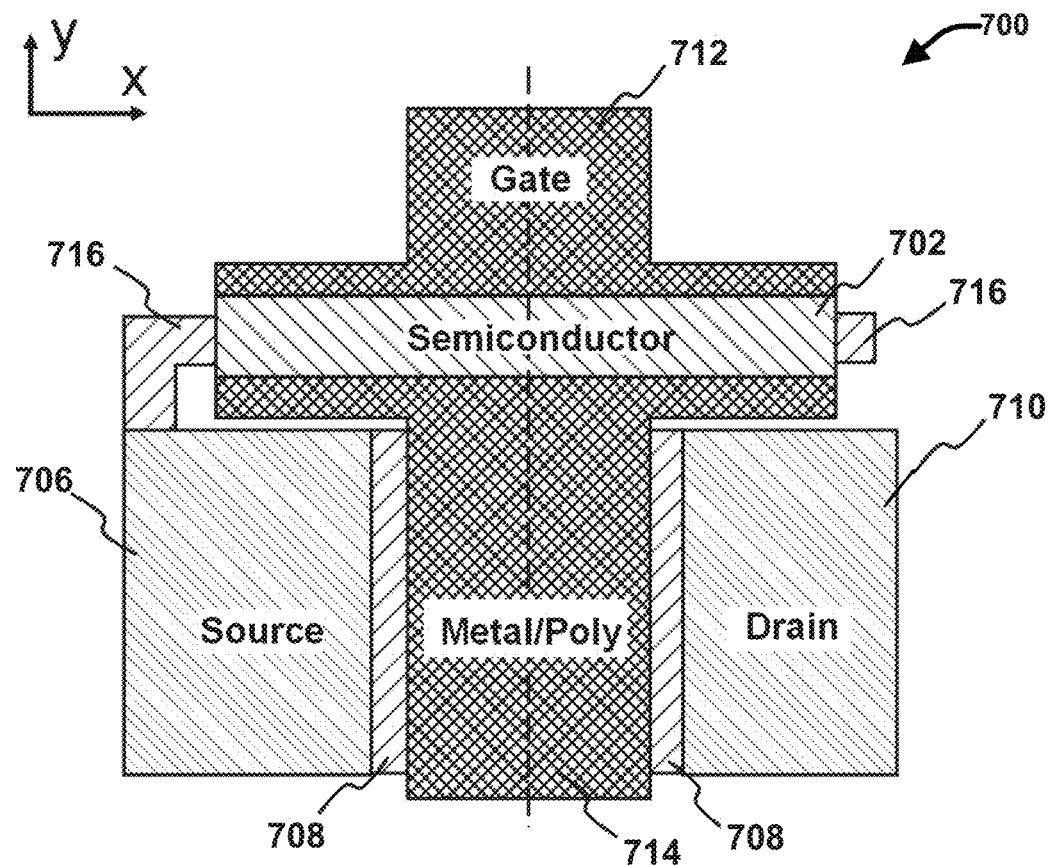
View (a)
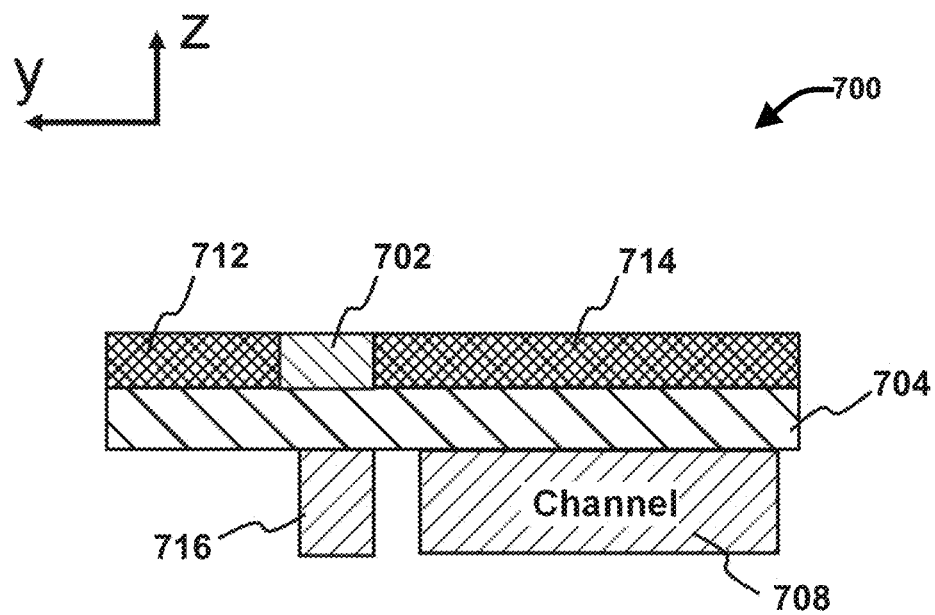
View (b)
FIG. 7

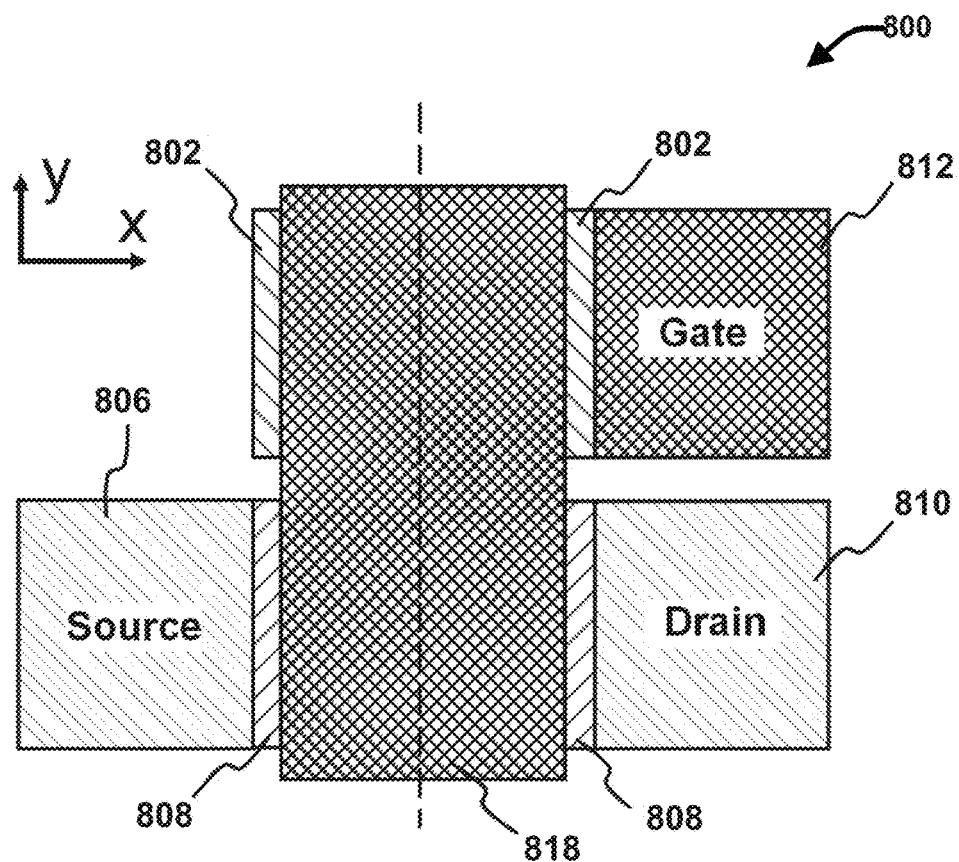
View (a)
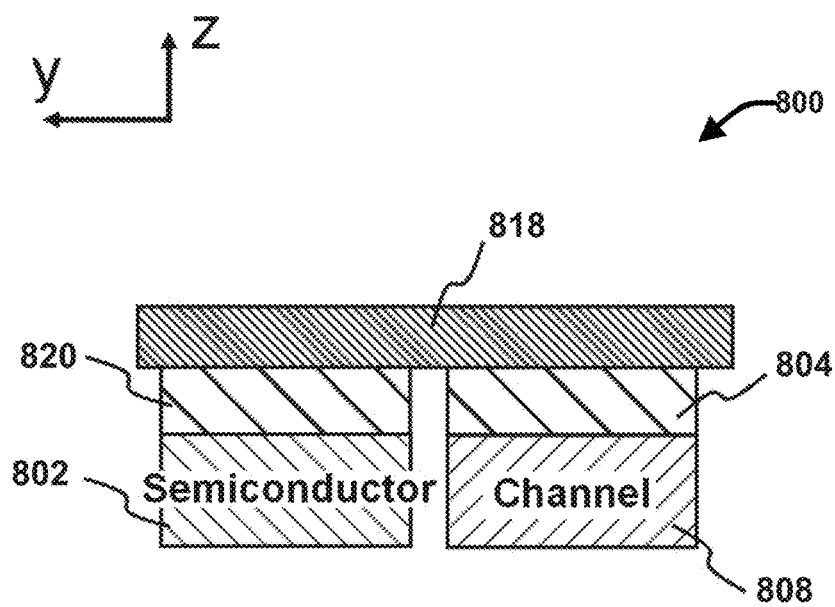
View (b)
FIG. 8

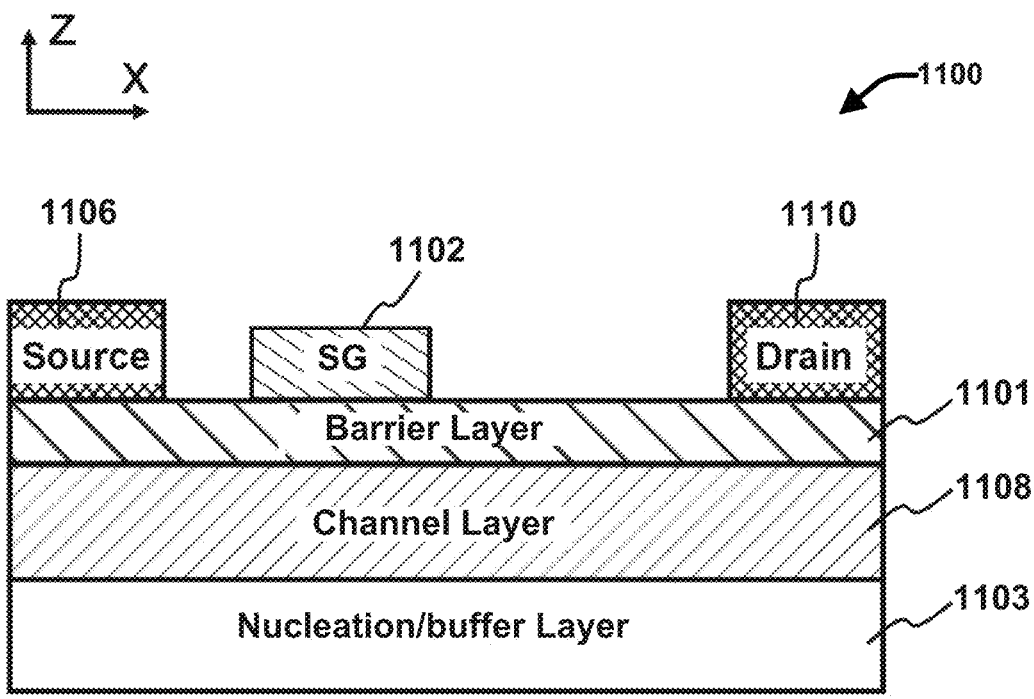
View (a)
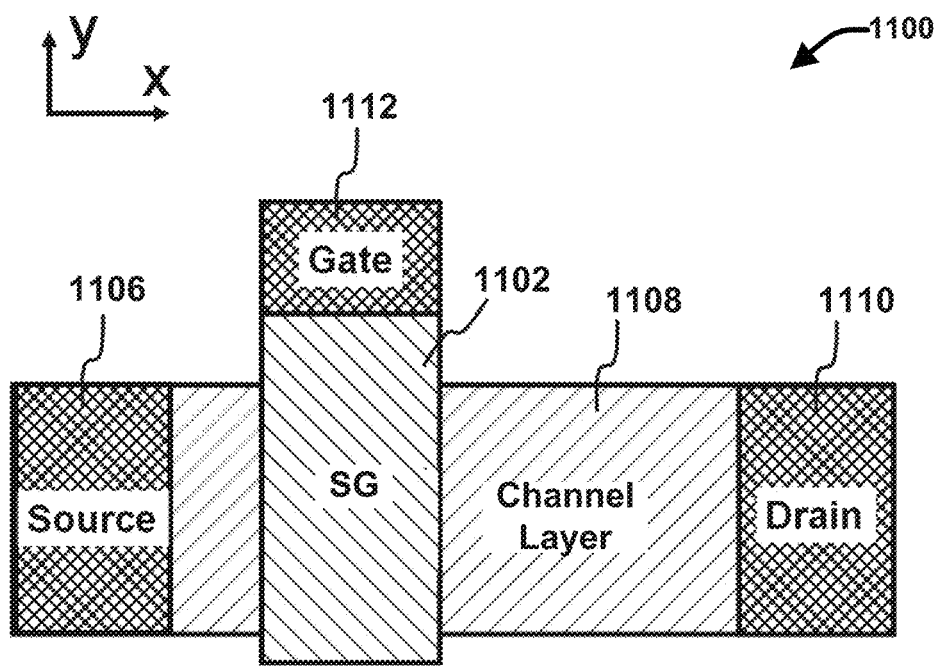
View (b)
FIG. 11

FIELD-EFFECT TRANSISTORS WITH SEMICONDUCTING GATE

RELATED APPLICATION

This application claims priority to U.S. Provisional Patent Application No. 62/764,619 filed on Aug. 13, 2018 and entitled "FIELD-EFFECT TRANSISTORS WITH SEMICONDUCTING GATE." The entirety of the aforementioned application is incorporated by reference herein.

TECHNICAL FIELD

This disclosure relates generally to field-effect transistors (FETs) and more particularly to FETs that include a semiconducting gate.

BACKGROUND

As a voltage-driven device, the field-effect transistor (FET) is at the heart of modern semiconductor technologies. The FET has the advantage of large input impedance and good isolation between the gate control and channel layer current flow and has supported a wide range of existing and emerging applications. For example, low-power FETs are implemented in both logic and analog integrated circuits (ICs) for high-speed computing and internet of things (IoT) devices. Owing to low static power consumption, complementary metal oxide semiconductor (CMOS) FETs have become the foundation of very large-scale integrated circuits (VLSI). Power FETs are another important branch of FETs. For example, power FETs based on wide bandgap semiconductors, such as gallium nitride (GaN) and silicon carbide (SiC), are fabricated with varied device structures, including the metal-oxide-semiconductor field-effect transistor (MOSFET), the metal-insulator semiconductor field-effect transistor (MISFET), and the high-electron-mobility transistor (HEMT) structures. These power devices can operate at high voltages and high temperatures with high speed and large current. They have broad applications in energy conversion and power supplies, and are important components for building a modern energy-efficient society Despite the above advantages and broad applications, the voltage-driven FETs have a drawback of being susceptible to overloaded gate voltage, especially at the forward gate bias. For example, many FETs include an insulating dielectric or barrier layer between the gate and the channel layer. This gate dielectric or barrier layer often experiences breakdown when a large (positive or negative) gate bias is applied to the gate. Over voltage stress can also cause severe threshold voltage instabilities in FETs. Although power FETs are designed to sustain a large drain layer bias, they are also vulnerable to the forward gate over voltage. Accordingly, techniques for developing FETs with good gate robustness and gate over voltage protection are vital, not only to prevent the gate dielectric breakdown but also to improve the device reliability.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 4 presents another example SG-FET in accordance with one or more second embodiments described herein.

FIG. 5 presents another example SG-FET in accordance with one or more third embodiments described herein.

FIG. 6 presents another example SG-FET in accordance with one or more fourth embodiments described herein.

FIG. 7 presents another example SG-FET in accordance with one or more fifth embodiments described herein.

FIG. 8 presents another example SG-FET in accordance with one or more sixth embodiments described herein.

FIG. 11 presents an example implementation of an SG-FET based on the AlGaN/GaN high electron mobility transistor (HEMT) technology in accordance with the one or more first embodiments described herein.

DETAILED DESCRIPTION

Figure 1:
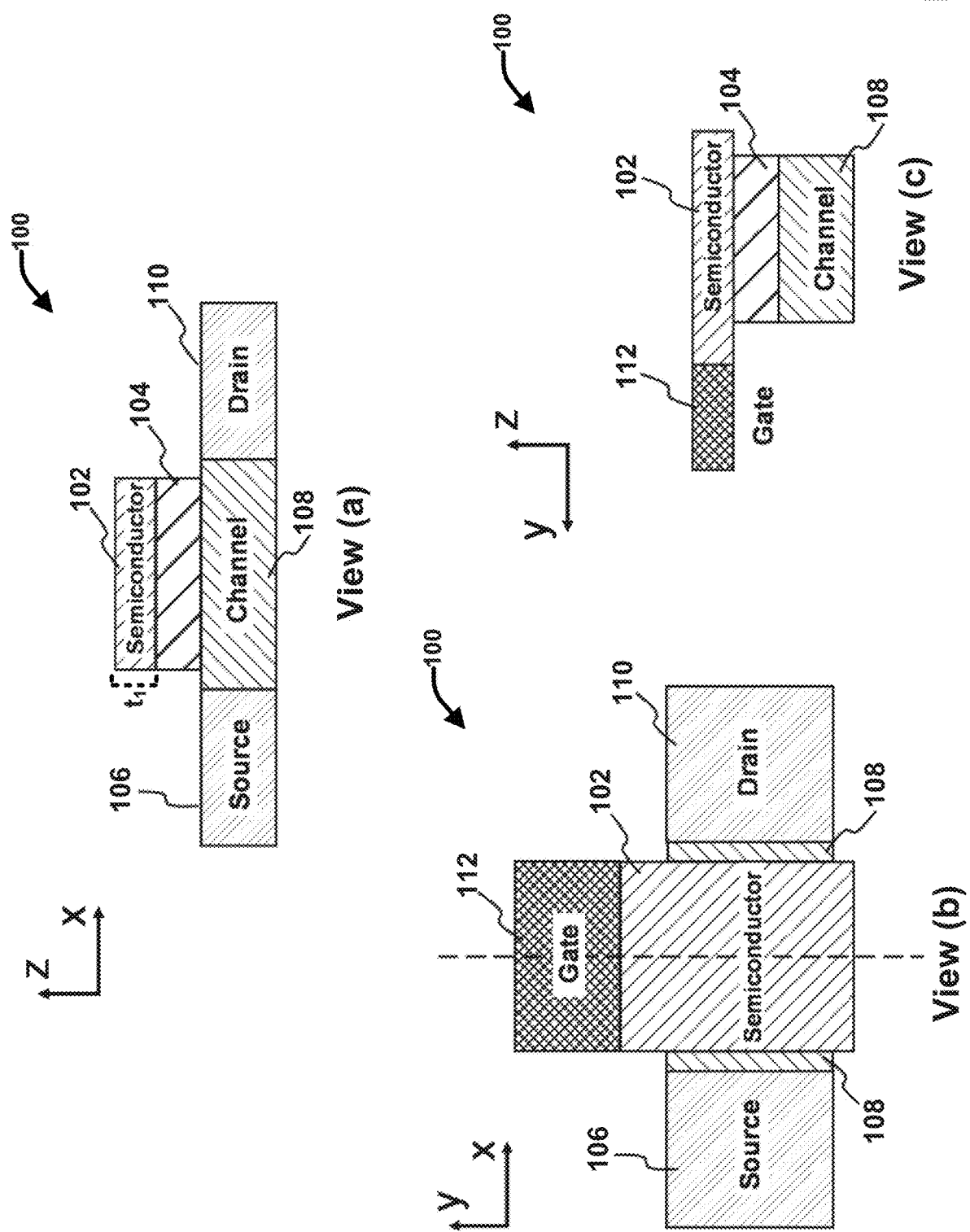
FIG. 1 presents an example, semiconducting gate (SG) field-effect transistor (SG-FET) in accordance with one or more first embodiments described herein.

The following detailed description is merely illustrative and is not intended to limit embodiments and/or applications or uses of embodiments. Furthermore, there is no intention to be bound by any expressed or implied information presented in the preceding Background section or in the Detailed Description section By way of introduction, the subject matter disclosed herein relates to FETs, and more particularly to FETs that employ a semiconducting gate (SG) or semiconducting gate (SG) layer to solve the gate over voltage issue. These innovative FETs and referred to herein as semiconducting gate field-effect transistors (SG-FETs). The disclosed SG-FETs employ a voltage-clamping scheme that is inherently embedded into the gate electrode, providing internal gate over voltage protection without taking up any additional device areas. In particular, in one or more embodiments, instead of employing a conventional metal or degenerately doped, thick polysilicon gate, the disclosed SG-FETs employ a thin layer of moderately doped semiconductor material, referred to herein as a semiconducting gate (SG) layer. In one or more embodiments, the SG layer placed above the channel layer and the gate dielectric layer. The SG layer should be thin enough and moderately doped to allow its conductivity to be effectively modulated by the electric field. The doping type of the SG layer is the same as that of the active channel layer when the channel is turned on to allow current flow. In this regard, the SG layer is doped with the same type of carrier as that of the ON-state FET channel layer. For example, for n-channel device, the SG layer is n-type doped, while for p-channel device, the SG layer is p-type doped.

To provide gate over voltage protection, the SG can be doped with a carrier density that has a depletion threshold voltage equal to the designed maximum effective gate voltage of the SG. In this regard, the doping of the SG can be specifically tuned so that the SG becomes completely depleted or substantially depleted (e.g., relative to a defined depletion threshold such as 90% or greater, 95% or greater, 98% or greater, etc.) when the underling channel layer is turned on in response to application of the effective gate voltage to the SG. The depletion of the SG can result in the decoupling of the gate from the channel and the consequent gate voltage clamping, so the above-channel gate region is shielded from any over-voltage stress. As a result, any additional (over voltage) applied to the gate terminal is decoupled from the gate dielectric (or barrier layer) and the underlying FET channel layer, resulting in inherent gate over voltage protection and suppressed gate leakage. Compared with conventional voltage driven FETs that employ a metal or heavily doped polysilicon gate and other peripheral protecting circuits or components, the subject SG-FET can achieve an inherent over-voltage protection and while enabling a compact device structure, resulting in great advantages in improved device reliability and stability without introducing other parasitics.

In various embodiments, the subject SG-FETs are exemplified as an n-type, depletion mode (D-mode), HEMT with an aluminum gallium nitride (AlGaN)/gallium nitride (GaN) (or AlGaN/GaN) heterostructure including a single layer MoS$_2$ as the SG, generally referred to herein as an MoS$_2$ SG-HEMT. Methods for fabricating such an MoS$_2$ SG-HEMT are also provided. The MoS$_2$ SG-HEMT shows no penalties to the two-dimensional electron gas (2DEG) channel layer turn-on, ON-state driving current, and the breakdown voltage. More importantly, when a large forward voltage (e.g., near or over the designed maximum gate voltage) is applied on the SG, not only does the applied forward voltage turn on the device by increasing the channel layer carrier density, it also depletes the SG, owing to the semiconductor nature of the SG. As a result, the SG can clamp the effective gate voltage to the depletion threshold voltage of the SG, which provides an inherent gate over voltage protection for the FET. In some embodiments, by adopting channel layer edge SG, the SG-FET can maintain the capability of current scaling and highspeed switching.

Although various embodiments are described with reference to AlGaN/GaN SG-HEMTs, it is contemplated and intended that the design of the various features of the subject SG-HEMTs can be applied to other heterostructures. In this regard, a person of ordinary knowledge in the art can extend the various features of the subject SG-HEMT to other heterostructure variations and forms of design. Moreover, the disclosed techniques for achieving gate over voltage protection using an SG with a carrier density that can clamp the effective gate voltage to the depletion threshold voltage of the SG are not limited to HEMTs and can be extended to various other types of FETs. For example, the disclosed techniques for forming SG-FETs with inherent gate over voltage protection can be applied to D-mode FETs, enhancement mode (E-mode) FETs, n-type FETs, p-type FETs, lateral FETs, vertical FETs, metal-oxide-semiconductor field-effect transistors (MOSFETs), metal-insulator semiconductor field-effect transistor (MISFETs), metal-semiconductor field-effect transistor (MESFETs), junction gate field-effect transistors (JFETs), thin-film transistors (TFTs), CMOS-FETs, and the like.

In one or more embodiments, an FET is provided that includes a channel layer and a SG layer formed with semiconductor materials. The SG layer comprises an embedded voltage-clamping function that provides internal gate over voltage protection without an additional protection circuit. The embedded voltage-clamping function is based on the SG layer having an effective gate voltage that is clamped to a depletion threshold of the SG layer. In some implementations, the SG layer is formed over the channel layer and the FET further comprises a gate dielectric or barrier layer formed between the channel layer and the SG layer. In other implementations, the FET further comprises a gate pad formed on a substrate region outside of channel layer and a metal-gate (MG) formed over the channel layer. With these implementations, the SG layer can be formed at an edge of the channel layer adjacent to the MG and between the MG and the gate pad.

The SG comprises carriers of a same carrier type (e.g., either n-type or p-type) as the ON-state channel layer. In this regard, the FET can be an n-type or a p-type transistor. The FET can also be a D-mode or E-mode transistor. The FET can also be a MOSFET, a MISFET, a MESFET, a JFET, a TFT, an HEMT, or the like.

In various implementations, the semiconductor material comprises two-dimensional materials. For example, in some implementations, the SG can be a single-layer semiconductor material (e.g., MoS$_2$, WSe$_2$, WS$_2$ or the like). The FET can also include a silicon substrate and a heterostructure incorporating a junction between two materials with different band gaps as the channel layer. For example, in some implementations, the heterostructure can comprise a first layer (e.g., a buffer/transition layer) of GaN formed on and adjacent to the silicon substrate, and a second layer (e.g., a barrier layer) of AlGaN formed on and adjacent to the first layer. The SG can further be formed on the heterostructure. With these implementations, the channel layer can comprise a two-dimensional electron gas (2DEG) formed at the heterojunction between the first layer and the second layer.

One or more embodiments are now described with reference to the drawings, wherein like referenced numerals are used to refer to like elements throughout. It should be appreciated that the various structures depicted in the drawings (e.g., the respective layers, regions, electrodes, gates and other elements) are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements, such as, for example, integrated conducting, insulating or semiconductor layers, present between the first element and the second element. As used herein, terms such as upper, lower, above, below, directly above, directly below, aligned with, adjacent to, right, left, vertical, horizontal, top, bottom, and derivatives thereof shall relate to the disclosed structures as oriented in the drawing figures.

With reference now to the drawing, FIG. 1 presents an example SG-FET 100 in accordance with one or more first embodiments described herein. Three different views or perspectives of the SG-FET 100 are shown. View (a) provides a side view of the SG-FET 100, View (b) provides a top view of the SG-FET 100, and View (c) provides a cross-sectional view of the SG-FET 100 (taken along the dashed line in View (b)).

The SG-FET 100 includes a channel layer 108 with source and drain (S/D) regions or electrodes formed on opposite sides of the channel layer 108. In various embodiments described herein, the S/D regions or electrodes are respectively referred to as a source layer 106 and a drain layer 110. The SG-FET 100 further includes a semiconducting gate (SG) layer 102, (hereinafter, SG layer 102), a gate dielectric layer 104 (also referred to as an insulator layer or barrier layer), and a gate electrode 112. In various embodiments, the SG-FET 100 can be fabricated on or supported by a substrate (not drawn). For example, the substrate can comprise silicon (Si), sapphire, diamond, silicon carbide (SiC), aluminum nitride (AlN), gallium nitride (GaN), and the like.

The channel layer 108 is electrically connected to the source layer 106 and drain layer 110. In accordance with this embodiment, the SG-layer 102 is formed directly over or above the channel layer 108 and the gate dielectric layer 104 with the gate dielectric layer being formed between the SG layer 102 and the channel layer 108. For example, as shown in all three views (e.g., View (a), View (b), and (View (c)), the SG layer 102 covers then entirety or substantially all of the channel layer 108. The SG layer 102 is further electrically coupled to the to the gate electrode 112 which is located outside the channel layer 108. For example, as shown in View (b) and View (c), the gate electrode 112 does not cover any portion of the channel layer 108. In this regard, the gate electrode 112 should be outside the region of the channel layer 108 such that the gate electrode 112 is not be directly coupled to the channel layer 108 by electric-field effect. For example, in accordance with this first embodiment of the disclose SG-FETs, the gate electrode 112 can be in direct contact with the SG layer 102 without contacting the gate dielectric layer 104 and/or the channel layer 108.

The material of source layer 106 and drain layer 108 can vary. For example, in some implementations, the source layer and/or the drain layer 108 can be formed with one or more doped semiconductor materials, such as Si, germanium (Ge), silicon germanium (SiGe), zinc oxide (ZnO), indium gallium zinc oxide (IGZO), gallium arsenide (GaAs), gallium nitride (GaN), silicon carbide (SiC), molybdenum disulfide (MoS$_2$), carbon nanotube (CNT), and the like. In other implementations, the source layer 106 and the drain layer 108 can also be formed with one or more metals, including (but not limited to), titanium (Ti), copper (Cu), nickel (Ni), gold (Au), aluminum (Al), chromium (Cr), and the like.

The channel layer 108 can be formed with a suitable semiconductor material, including those described with reference to the source layer 106 and the drain layer 110 (e.g., Si, Ge, SiGe, ZnO, IGZO, GaAs, GaN, SiC, MoS$_2$, CNT and so on). In some implementations in which the source layer 106 and the drain layer 110 are respectively formed with a semiconductor material, the channel layer 108 can also be formed with the same semiconductor material. The channel layer 108 can be doped or un-doped, which will influence the threshold voltage of the SG-FET 100 and determine whether the SG-FET is a depletion mode (D-mode) or enhancement-mode (E-mode) device. In this regard, in some implementations, the SG-FET 100 can be formed as a D-mode device while in other implementations, the SG-FET can be formed as an E-mode device.

The gate dielectric layer 104 can include one or more layers of an insulator and/or a semiconductor material. For example, the gate dielectric layer 104 can be formed with a single layer of an insulator or semiconductor material but could also be a combination of layers of insulators and/or semiconductors.

The SG layer 102 can include one or more layers of semiconductor material that are doped with carriers (e.g., either electrons or holes). As described in greater detail infra, the type of carriers and the doping concentration of the SG layer 102 is specifically tailored to provide inherent gate over voltage protection for the SG-FET 100. In various embodiments, the SG layer 102 consists of only a single, thin layer of doped semiconductor material. In other implementations, the SG layer 102 can comprise two or more layers of doped semiconductor material. The type of semiconductor material employed for the SG layer 102 can vary. For example, in some embodiments, the semiconductor material can include $MoS_2$. Other suitable semiconductor materials that can be employed for the SG layer 102 can include but are not limited to: Si, Ge, SiGe, ZnO, IGZO, GaAs, GaN, SiC, tungsten diselenide ($WSe_2$), tungsten disulfide ($WS_2$) black phosphorus, CNT and the like. In various implementations, the material of the SG layer 102 can be the same as the material used for the channel layer 108.

The thickness ($t_1$) of the SG layer 102 can vary, however in various exemplary embodiments, the SG layer 102 comprises a single thin layer of doped semiconductor material. In this regard, the thickness ($t_1$) of the SG layer 102 can be less than that of conventional FET conducting gates. For example, in some implementations, the thickness of the SG layer 102 can be less than or equal to 10 nanometers (nm). In another implementation, the thickness ($t_1$) of the SG layer 102 can be less than or equal to 5.0 nm. In yet another implementation, the thickness ($t_1$) can be less than or equal to 0.65 nm.

The material of gate electrode 112 can vary and include a variety of conducting (as opposed to semi-conducing materials). For example, the gate electrode 112 can comprise one or more metals, heavily doped polysilicon or other heavily doped semiconductor materials.

In accordance with this first embodiment, the SG layer 102 is formed over or otherwise in close proximity to or the channel layer 108 so that its electric charge is able to affect the channel layer 108. In particular, the SG layer 102 can control the flow of carriers (electrons or holes) flowing from the source layer 106, through the channel layer 108 and to drain layer 110 based on application of a voltage positive or negative to gate electrode 112, depending on whether the channel layer is an n-type or a p-type channel. In this regard, the voltage applied on the gate electrode 112 influences the conductivity of the channel layer 108 indirectly through the SG layer 102.

In accordance with various embodiments of the SG-FETs described herein, the type of carriers included in the SG layer 102 are the same type of carriers included in the channel layer 108 when the channel layer 108 is turned on (or otherwise in an ON-state). In particular, to provide over-voltage protection, the SG layer 102 should have the same type of carriers as that of the active channel layer, wherein the active channel layer refers to the state of the channel layer 108 when the channel layer is turned on (or otherwise in an ON-state) to allow current to flow from the source layer 106 through the channel layer 108 and to the drain layer 110. For example, in implementations in which the channel layer 108 is an n-type channel, the SG layer 102 can comprise a thin layer of semiconductor material (moderately) doped with n-type carriers. Likewise, in implementations in which the channel layer 108 is a p-type channel, the SG layer 102 can comprise a thin layer of semiconductor material (moderately) doped with p-type carriers. In some embodiments, as described in greater detail with reference to FIG. 10, in addition to the moderately doped layer including the same type of carriers as the active channel layer, the SG layer 102 can further comprise one or more additional semiconductor layers formed on top of this layer with an opposite carrier type.

In this regard, in implementations in which the SG-FET 100 is an n-channel device, the SG-layer 102 can be n-type, such that application of a large positive gate bias to the gate electrode 102 would resulting in depleting the carriers of the SG-layer 102 above the channel layer 108. If the doping of SG-layer 102 is carefully tuned so that it becomes completely depleted when the underlying channel layer 108 is fully turned on, any additional voltage appeared at the gate electrode 112 would be decoupled from the gate dielectric layer 104 and the underling channel layer 108, resulting in inherent gate over-voltage protection and suppressed gate leakage for the SG-FET 100 without any additional protection circuits or components.

For example, in one or more embodiments, the SG layer 102 can have a maximum effective gate voltage ($V_G$) that is clamped to a depletion threshold voltage of the SG layer 102. In this regard, the SG layer 102 can have a carrier density (e.g., density of carrier 106) that is tailored to the effective gate voltage of the SG layer 102 such that the SG layer 102 becomes completely depleted or substantially depleted (e.g., relative to a defined depletion threshold such as 90% or greater, 95% or greater, 98% or greater, etc.) in response to application of a voltage to the SG layer 102 that is greater than or equal to the absolute value of the effective gate voltage $V_G$. For example, in implementations in which the channel layer 108 and the SG layer 102 are n-type, application of a positive gate bias to the SG layer 102 would result in partially depleting the carriers 106 from the SG layer 102. As the positive gate bias is increased (e.g., if a large forward gate bias is applied), eventually the SG layer 102 would become completely depleted of carriers. Likewise, in implementations in which the channel layer 108 and the SG layer 102 are p-type, application of a negative gate bias to the SG layer 102 would result in partially depleting the carriers from the SG layer 102. As the negative gate bias is decreased, eventually the SG layer 102 would become completely depleted of carriers.

Thus in accordance with various embodiments described herein, the doping concentration of the SG layer 102 can be tailored so that the SG layer 102 becomes completely depleted (e.g., relative to a defined depletion threshold such as 90% or greater, 95% or greater, 98% or greater, etc.) when the underlying channel layer 108 is fully turned on (e.g., based on application of a positive voltage greater than or equal to $V_G$ for an n-type channel layer and a negative voltage less than or equal to $V_G$ for a p-type channel layer). Further, due to the structure of the SG-FET shown in FIG. 1, any additional voltage applied to the SG layer 102 (e.g., greater than the $V_G$) would be decoupled from the gate dielectric layer 104 and the underling channel layer 108. In this context, the depletion threshold refers to the voltage threshold (e.g., either positive or negative depending on the carrier type) that when applied to the SG layer 102 results in complete depletion or substantial depletion (e.g., relative to a defined depletion threshold such as 90% or greater, 95% or greater, 98% or greater, etc.) of the carriers therein and fully turning on of the underlying channel layer 108. Accordingly, in various embodiments, the SG layer 102 can be doped with a carrier density/concentration that has a depletion threshold equal to the designed maximum effective gate voltage $V_G$ of the SG layer 102, thereby providing an inherent gate over voltage protection function and suppressed gate leakage function for the SG-FET 100.

Figure 2A:
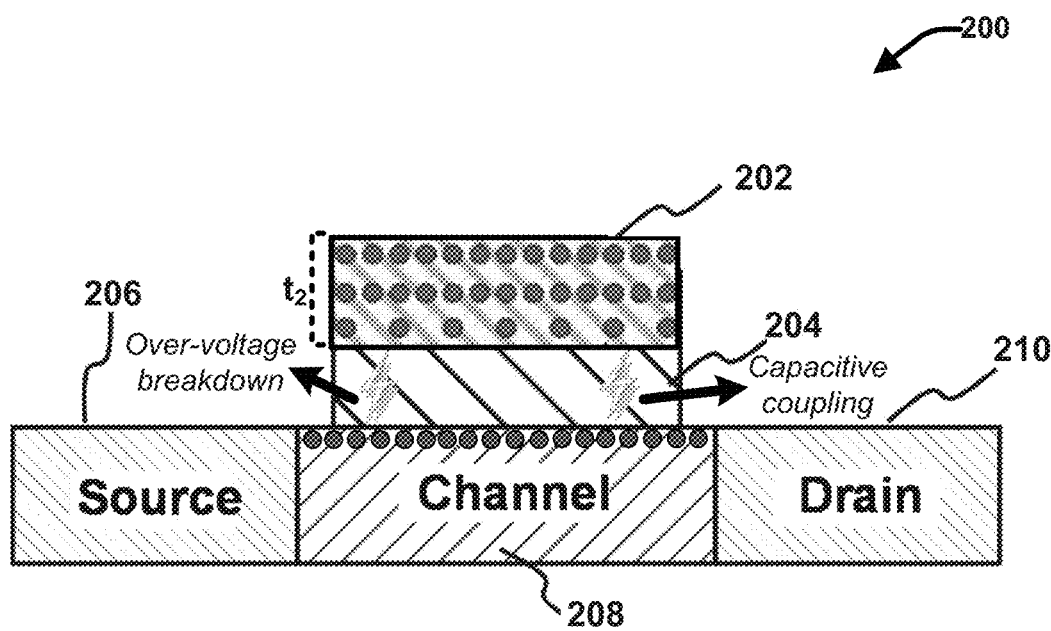
FIG. 2A presents an example, conventional, voltage-driven field-effect transistor in accordance with one or more embodiments described herein.
Figure 2B:
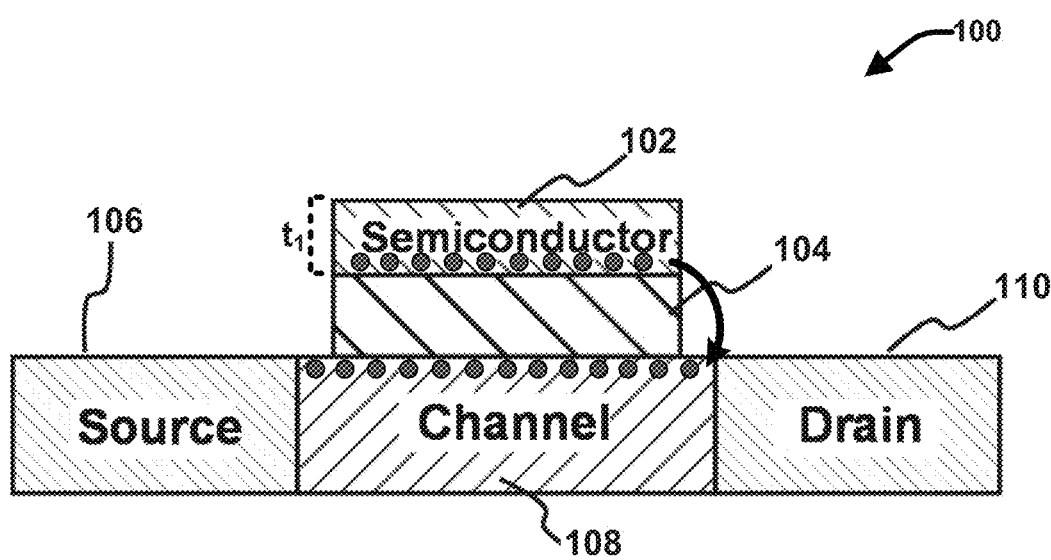
FIG. 2B presents another example view of the SG-FET in accordance with the one or more first embodiments described herein.

For comparative purposes, FIG. 2A presents an example, conventional voltage-driven FET 200 in accordance with one or more embodiments described herein. FIG. 2B presents another example view of the SG-FET 100 in accordance with the one or more first embodiments described herein. In particular, FIG. 2B illustrates the carriers (depicted by the circles) included in the SG layer 102. FIG. 2B also illustrates the capacitive coupling mechanism of the disclosed SG- FETs, wherein the carriers in the SG layer 102 become depleted by the back gate (i.e., the channel layer) bias as the channel layer is turned on. Once the carriers are completed depleted (not shown) from the SG layer 102 layer (e.g., when the channel layer is fully turned on), the gate voltage is decoupled from the channel.

With reference to FIG. 2A in view of FIG. 2B, similar to the SG-FET 100, the conventional, voltage driven FET 200 generally includes a channel layer 208 formed between a source layer 206 and a drain layer 10. The conventional, voltage driven FET 200 also includes a gate layer 202 formed over the channel layer 208 with a gate dielectric layer 204 formed between the gate later 202 and the channel layer 208. Unlike the SG-FET 100, the gate layer 202 of the conventional, voltage driven FET 200 comprises a metal gate or a thick, heavily doped polysilicon gate. For example, in the embodiment shown, the gate layer 202 is depicted as a thick, heavily doped polysilicon gate. Insulating layer(s) or semiconductor layer(s) is (are) used as the gate dielectric layer 204 to provide capacitive coupling between the gate layer 202 and the channel layer 208. A large electric field can be forced on the gate dielectric layer 204 when the gate layer 202 is applied with a large voltage. As a result, the gate dielectric layer 204 experiences over-voltage breakdown and/or threshold voltage instabilities.

In this regard, with conventional, voltage driven FETs such as FET 200 in which the gate layer 202 includes heavily doped polysilicon, the doping concentration of the carriers (depicted by the circles) within the gate 202 is significantly higher (e.g., relative to a threshold difference) than the doping concentration of the carriers within the SG layer 102 of the SG-FET 100. For example, a gate layer 202 formed with an Ni film as thin as 10 nm has at least a carrier density of about $1.8 \times 10^{17}$ cm$^{-2}$, which is far larger than the sheet carrier density of the active channel ($1.0 \times 10^{17}$ cm$^{-2}$) when the channel layer 208 is already considered fully turned on. In addition, the thickness of ($t_2$) of the gate layer 202 is generally substantially greater than the thickness ($t_1$) of the SG layer 102 of the SG-FET 100. Due to the extremely high carrier density of the gate layer 202 of the conventional, voltage driven FET 200, an over-voltage gate stress can be applied on the gate dielectric layer 204 by the metal/polysilicon gate without any limitations. However, as noted above, when a large gate voltage is applied to the gate layer 202, a large electric field is forced on the gate dielectric layer 204, causing the gate dielectric layer 204 to experience over-voltage breakdown and/or threshold voltage instabilities.

In contrast, with the disclosed SG-FETs such as that shown in FIG. 2A (and other described herein), instead of using the conventional conducting gate comprising metal or thick layer of heavily doped polysilicon, a semiconducting gate (SG) based on a thin layer of moderately doped semiconductor is disclosed. In contrast to the metal or polysilicon gate in the prior art, the conductivity of SG layer 102 can be effectively modulated by the gate electric field, and application of a large gate bias to the gate electrode 112/SG layer 102 will deplete the SG layer 102 and decouple the SG layer 102 from the underlying gate dielectric layer 104 and the channel layer 108. As a result, the SG layer 102 is capable of providing inherent over-voltage protection for FETs without the need of any additional peripheral circuits or components, and immunities of both forward and reverse gate stresses can be achieved.

Figure 3:
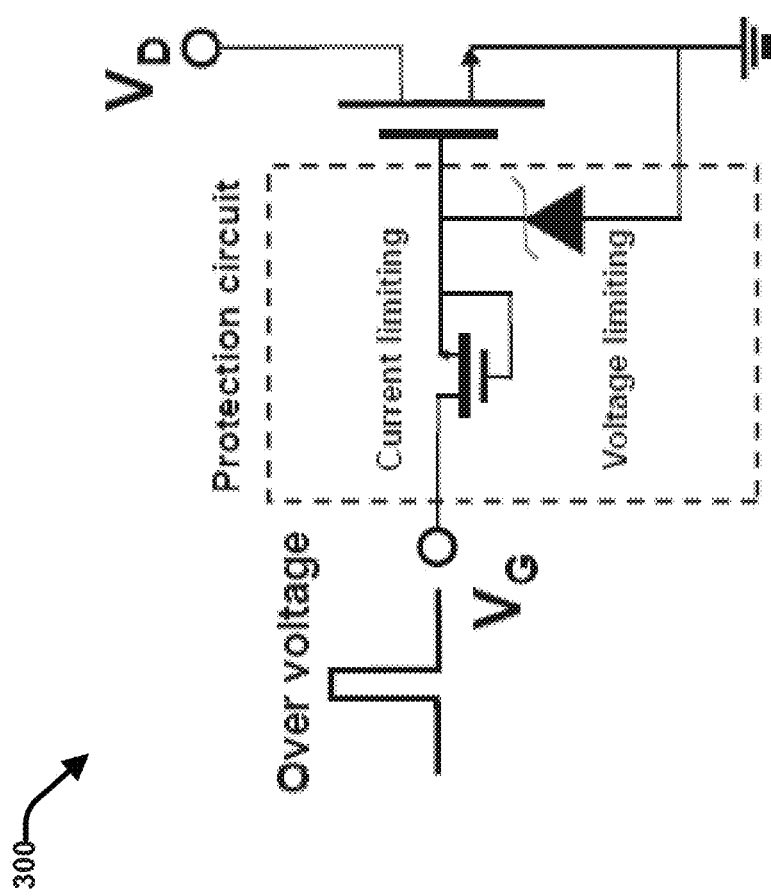
FIG. 3 presents a schematic circuit diagram illustrating the conventional gate over voltage protection techniques employed for conventional, voltage driven FETs.

FIG. 3 presents a schematic circuit diagram 300 illustrating the conventional gate over voltage protection techniques employed with conventional, voltage driven FETs such as FET 200. In this regard, various gate over voltage protection techniques have been developed for CMOS FETs as well as for HEMT FETs. These protection schemes can be categorized into two types: current limiting and voltage limiting, as schematically drawn circuit diagram 300. Unlike the gate over voltage protection function provided by the disclosed SG-FETs (e.g., SG-FET 100 and the like) which is inherently embedded within the gate electrode 112/SG layer 102, the current limiting and voltage limiting schemes illustrated in circuit diagram 300 require external peripheral components such as bootstrapped FETs, Zener diodes, and the like. These external peripheral components not only degrade the device performance with increased gate capacitance or gate resistance, but also impose extra difficulty for monolithic integration. In this regard, the disclosed voltage-clamping scheme, being inherently embedded into the gate electrode, provide internal gate over voltage protection without taking up any additional device areas.

FIG. 4 presents another example SG-FET 400 in accordance with one or more second embodiments described herein. Two different views or perspectives of the SG-FET 400 are shown. View (a) provides a top view of the SG-FET 400, and View (b) provides a cross-sectional view of the SG-FET 400 (taken along the dashed line in View (a)).

Similar to the SG-FET 100 of the first embodiment described with reference to FIG. 1, the SG-FET 400 also includes a channel layer 408 with a source layer 406 and a drain layer 410 formed on opposite sides of the channel layer 408. The SG-FET 400 also includes a SG layer 402, a gate dielectric layer 404, and a gate electrode 412. The SG layer 402, the gate dielectric layer 404, the source layer 406, the channel layer 408, the drain layer 410, and the gate electrode 412 can comprise same or similar materials and/or provide same or features and functionalities as the corresponding components described with reference to FIG. 1 and SG-FET 100. In this regard, the SG layer 402 can correspond to SG layer 102, the gate dielectric layer 404 can correspond to gate dielectric layer 104, the source layer 406 can correspond to the source layer 106, the channel layer 408 can correspond to the channel layer 108, the drain layer 410 can correspond to the drain layer 110, and the gate electrode 412 can correspond to the gate electrode 112. Repetitive description of like elements employed in respective embodiments is omitted for sake of brevity.

SG-FET 400 differs from SG-FET 100 with respect to the position of the SG layer 402 relative to the channel layer 408 and the addition of a conducting gate (CG) layer 414, (hereinafter, CG layer 414) to the gate terminal. In this regard, the SG-FET 400 employs both a SG layer 402 and a CG layer 414 for the gate electrode or gate terminal. The CG layer 414 can include various suitable conducting materials, such as metal materials and/or heavily doped polysilicon. For example, in one embodiment, the CG layer 414 can comprise a Ni/Au metal gate (MG). Other suitable materials for the CG layer 414 can include but are not limited to: Ti, Al, Ni, Au, W, V, Ta and the like.

In the embodiment shown, the SG layer 402 covers only part of the channel layer 408, with the remaining part of the channel layer 408 being covered by the CG layer 414. For example, as shown in View (a) and View (b) the SG layer 402 can be formed directly over a side edge of the channel layer 408, partially covering the channel layer 408 and partially outside of the channel layer 408. The CG layer 414 is further positioned over a central and a greater area of the channel layer 408 relative to the SG layer 402, with the SG layer 402 being formed between the gate electrode 412 and the CG layer 414. In various embodiments, a SG layer with this position is referred to as a channel layer edge SG.

The CG layer 414 is electrically connected to the gate electrode 412 indirectly through the SG layer 402. As a result, the partial coverage of the channel layer 408 by the SG layer 402 maintains the inherent gate over-voltage protection capability afforded by the SG layer 402 as described with reference to the SG layer 102, while at the same time reduces the gate resistance of the SG-FET 400. This channel layer edge SG configuration also facilitates scaling of the ON current level for high power applications.

Aside from these noted differences, the SG-FET 400 can comprise substantially same or similar materials, features and functionalities as SG-FEG 100. For example, the SG-FET 400 can also be fabricated on or supported by a substrate (not drawn), such as but not limited to substrate comprising Si, sapphire, diamond, SiC, AlN, GaN, and the like. The source layer 406 and drain layer 410 can comprise doped semiconductors, such as Si, Ge, SiGe, ZnO, IGZO, GaAs, GaN, SiC, $MoS_2$, CNT and so on, but can also comprises metals, such as Ni, Au, Al, Cr and the like. In various implementations, the channel layer 408 comprises a semiconductor material, which can be the same as that of the source layer 406 and drain layer 410 (in implementations in which the source layer 406 and the drain layer 410 are formed with semiconductor materials). In another implementations, the channel layer 408 can be formed with other kinds of semiconductor materials, including but not limited to: Si, Ge, SiGe, ZnO, IGZO, GaAs, GaN, SiC, MoS2, CNT and so on. The channel layer 408 can be doped or un-doped, which as noted above, will influence the threshold voltage of the SG-FET 400 and determine whether the SG-FET is a D-mode or E-mode device. The channel layer 408 is electrically connected to the source layer 406 and drain layer 410. The gate dielectric layer 404 can comprise a single layer of insulator or semiconductor material or a combination of layers of insulators and/or semiconductors.

The SG layer 402 preferentially consists of a thin layer of moderately doped semiconductor formed over the channel layer 408 with gate dielectric layer 404 formed between the SG layer 402 and the channel layer 408. In some implementations, the material of the SG layer 402 can be the same as the material of the channel layer 408. In other implementations, the SG layer 402 can comprise various other semiconducting materials, including but not limited to: Si, Ge, SiGe, ZnO, IGZO, GaAs, GaN, SiC, MoS2, CNT and so on. The SG layer 402 is electrically connected to the gate electrode 412. The gate electrode 412 can be formed with a metal, heavily doped polysilicon or other heavily doped semiconductors.

In various implementations, the material of the CG layer 414 can be the same as the material as the gate electrode 412, but can also comprises other metals, other heavily doped polysilicon layers and/or other heavily doped semiconductors. The gate electrode 412 is located outside of the channel layer 408 (e.g., the gate electrode 412 should not be directly coupled with the channel layer 408 by electric-field effect). The voltage applied on gate electrode 412 influences the conductivity of the channel layer 408 indirectly through the SG layer 402 and the CG layer 414. To provide over-voltage protection, the SG layer 402 should have the same type of carriers as that of the channel layer 408 when active or otherwise in an ON-state (e.g., the type of carriers when the channel layer 408 is turned on to allow current to flow from the source layer 406, through the channel layer 408, and to the drain layer 410.

FIG. 5 presents another example SG-FET 500 in accordance with one or more third embodiments described herein. Two different views or perspectives of the SG-FET 500 are shown. View (a) provides a top view of the SG-FET 500, and View (b) provides a cross-sectional view of the SG-FET 500 (taken along the dashed line in View (a)).

The SG-FET 500 includes same or similar features and functionalities as SG-FET 400. In this regard, SG-FET 500 includes a channel layer 508 with a source layer 506 and a drain layer 510 formed on opposite sides of the channel layer 508. The SG-FET 500 also includes a SG layer 502, a gate dielectric layer 504, and a gate electrode 512 and a CG layer 514. The SG layer 502, the gate dielectric layer 504, the source layer 506, the channel layer 508, the drain layer 510, the gate electrode 512 and the CG layer 514 can comprise same or similar materials and/or provide same or features and functionalities as the corresponding components described with reference to SG-FET 100 and/or SG-FET 400. In this regard, the SG layer 502 can correspond to SG layer 102 and/or 402, the gate dielectric layer 504 can correspond to gate dielectric layer 104 and/or 404, the source layer 506 can correspond to the source layer 106 and/or 406, the channel layer 508 can correspond to the channel layer 108 and/or 408, the drain layer 510 can correspond to the drain layer 110 and/or 410, the gate electrode 512 can correspond to the gate electrode 112 and/or 412, and the CG layer 514 can correspond to CG layer 414. Repetitive description of like elements employed in respective embodiments is omitted for sake of brevity.

SG-FET 500 differs from SG-FET 400 with respect to the position of the SG layer 502 and the CG layer 514 relative to the channel layer 508 and the addition of a semiconductor layer 516 to the SG-FET 500. In particular, the SG-FET 500 includes a semiconductor layer 516 that extends from the source layer 506 toward the drain layer 510 in a direction parallel to the channel layer 508. The semiconductor layer 516 however is separated from (e.g., does not contact) the channel layer 508 or the drain layer 510. With this embodiment, the SG layer 502 is formed directly over the semiconductor layer 516 with the gate insulator layer formed between the SG layer 502 and the semiconductor layer. The CG layer 514 is further formed directly over the channel layer 508 with the gate dielectric layer 504 being formed between the CG layer 514 and the channel layer 508. The SG layer 502 does not cover any portion of the channel layer 508 and the CG layer 514 does not cover any portion of the semiconductor layer 516. In this regard, unlike the SG-FET 400 wherein the CG layer 414 and the SG layer 402 are both formed over a different parts of a single connected layer, channel layer 408, the SG-FET 500 splits the layers formed under the SG layer 502 and the CG layer 514 into two separate layers, the semiconductor layer 516 and the channel layer 516, respectively. The semiconductor layer 516 and the channel layer 508 independently connect to the source layer 506. Similar to the SG-FET 400, in the SG-FET 500, the SG layer 502 is formed between and electrically connected to the gate electrode 512 and the CG layer 514. In this regard, the CG layer 514 is electrically connected to the gate electrode 512 indirectly through the SG layer 502. In accordance with this embodiment, all possible electric paths from the gate electrode 512 to the CG layer 514 will pass through the SG layer 502 which is formed over the semiconductor layer 516 and which is physically isolated/separated from the channel layer 508.

In accordance with this third embodiment, the SG-FET 500 can also be fabricated on or supported by a substrate (not drawn), such as but not limited to substrate comprising Si, sapphire, diamond, SiC, AlN, GaN, and the like. The source layer 506 and drain layer 510 can comprise doped semiconductors, such as Si, Ge, SiGe, ZnO, IGZO, GaAs, GaN, SiC, MoS$_2$, CNT and so on, but can also comprises metals, such as Ni, Au, Al, Cr and the like. In various implementations, the channel layer 508 comprises a semiconductor material, which can be the same as that of the source layer 506 and drain layer 510 (in implementations in which the source layer 506 and the drain layer 510 are formed with semiconductor materials). In another implementations, the channel layer 508 can be formed with other kinds of semiconductor materials, including but not limited to: Si, Ge, SiGe, ZnO, IGZO, GaAs, GaN, SiC, MoS2, CNT and so on. The channel layer 508 can be doped or un-doped, which as noted above, will influence the threshold voltage of the SG-FET 500 and determine whether the SG-FET is a D-mode or E-mode device. The channel layer 508 is electrically connected to the source layer 506 and drain layer 510. The gate dielectric layer 504 can comprise a homogenous layer of insulator or semiconductor material or a combination of layers of insulators and/or semiconductors.

The material of the semiconductor layer 516 could be the same as the channel layer 508, but could also be other kind of semiconductors, such as Si, Ge, SiGe, ZnO, IGZO, GaAs, GaN, SiC, MoS$_2$, CNT and so on. The SG layer 502 can comprise a thin layer (e.g., less than 10 nm) of moderately doped semiconductor, which is located on top of the semiconductor layer 516 and the gate dielectric layer 504. The material of the SG layer 502 can be the same as the channel layer 508, but can also include other thin-layer semiconductors, such as Si, Ge, SiGe, ZnO, IGZO, GaAs, GaN, SiC, MoS$_2$, CNT and so on. The SG layer 502 is electrically connected to the gate electrode 512. The gate electrode 512 can be formed with a metal, heavily doped polysilicon or other heavily doped semiconductors.

In various implementations, the material of the CG layer 514 can be the same as the material as the gate electrode 512, but can also comprises other metals, other heavily doped polysilicon layers and/or other heavily doped semiconductors. The material of the semiconductor layer 516 can be the same as the channel layer 508, but can also be other semiconductor, such as Si, Ge, SiGe, ZnO, IGZO, GaAs, GaN, SiC, MoS$_2$, CNT and so on. The semiconductor layer 516 can be doped or undoped, which can influence the clamped gate voltage of the device. The gate electrode 512 should be outside of the channel layer 508 and the semiconductor layer 516, (e.g., the gate electrode 512 should not be directly coupled with the channel layer 508 by electric-field effect). The voltage applied on gate electrode 512 influences the conductivity of the channel layer 508 and the semiconductor layer 516 indirectly through the SG layer 502 and the CG layer 514. To provide over-voltage protection, the SG layer 502 should have the same type of carriers as that of the channel layer 508 when active or otherwise in an ON-state (e.g., the type of carriers when the channel layer 508 is turned on to allow current to flow from the source layer 506, through the channel layer 508, and to the drain layer 510).

FIG. 6 presents another example SG-FET 600 in accordance with one or more fourth embodiments described herein. Two different views or perspectives of the SG-FET 600 are shown. View (a) provides a top view of the SG-FET 600, and View (b) provides a cross-sectional view of the SG-FET 600 (taken along the dashed line in View (a)).

The SG-FET 600 includes same or similar features and functionalities as other SG-FETs described herein (e.g., SG-FET 100, SG-FET 400, SG-FET 500 and the like). In this regard, SG-FET 600 includes a channel layer 608 with a source layer 606 and a drain layer 610 formed on opposite sides of the channel layer 608. The SG-FET 600 also includes a SG layer 602, a gate dielectric layer 604, and a gate electrode 612 and a CG layer 614. The SG layer 602, the gate dielectric layer 604, the source layer 606, the channel layer 608, the drain layer 610, the gate electrode 612 and the CG layer 614 can comprise same or similar materials and/or provide same or features and functionalities as the corresponding components described with reference to SG-FET 100, SG-FET 400 and/or SG-FET 500. In this regard, the SG layer 602 can correspond to SG layer 102, 402 and/or 502, the gate dielectric layer 604 can correspond to gate dielectric layer 104, 404 and/or 504, the source layer 606 can correspond to the source layer 106, 406 and/or 506, the channel layer 608 can correspond to the channel layer 108, 408 and/or 508, the drain layer 610 can correspond to the drain layer 110, 410 and/or 510, the gate electrode 612 can correspond to the gate electrode 112, 412 and/or 512, and the CG layer 614 can correspond to CG layer 414 and/or 514. Repetitive description of like elements employed in respective embodiments is omitted for sake of brevity.

SG-FET 600 differs from previously described SG-FETs (e.g., SG-FET 400) with respect to the structure and relative locations of the SG layer 602, the channel layer 608, and the CG layer 614. In this regard, with reference to FIG. 6 in view of FIG. 4, similar to the SG-FET 400 of the second embodiment, the SG-FET 600 includes an SG layer 602 formed between a CG-layer 614 and the gate electrode 612, wherein the SG layer 602 indirectly electrically couples the gate electrode 612 to the CG layer 614. As shown in View (b) The gate dielectric layer 604 is also formed directly underneath each of these three elements of the gate terminal (e.g., the gate electrode 612, the SG layer 602 and the CG layer 614). Different from SG-FET 400, in the embodiment shown, the SG layer 602 is located completely outside the area between the source layer 606 and the drain layer 610 over an extended portion 608' of the channel layer 608. In particular, with this embodiment, the channel layer 608 includes an extended portion 608' that extends outside the area between the source layer 606 and the drain layer 610. The SG layer 602 is formed over or partially over this extended portion 608' of the channel layer 608. For example, in the embodiment shown, the SG layer 602 is formed on/over an edge of the extended portion 608' channel layer 608, such that a portion of the SG layer 602 can cover the extended portion 608' of the channel layer and another portion of the SG layer 602 is formed outside of the channel layer entirely (e.g., including the channel layer 608 and the extended portion 608' of the channel layer). In this regard, the SG layer 602 can be considered a channel layer edge SG. In other embodiments, the entirety of the SG layer 602 can cover the extended portion 608' of the channel layer 608.

In accordance with SG-FET 600, the CG layer 614 can be cover the portion of the channel layer 608 excluding the extended portion 608'. In this regard, as shown in View (a), the CG layer 614 can be formed on and/or covers the portion of the channel layer 608 located between the source layer 606 and the drain layer 610. The CG layer 614 is electrically connected to the gate electrode 612 through the SG layer 602. With this embodiment, because the SG layer 602 is located outside the area between the source layer 606 and the drain layer 610, the SG layer 602 can have a much wider and tunable length of contact with the gate electrode 612 and the CG layer 614 relative to the SG-FET 400. As a result, the SG-FET 600 has the advantage of further reduced gate resistance. For example, in the embodiment shown, the portion of the gate electrode 612 that contacts the SG layer 602 on one side of the SG layer 602 can extend the entire length of the SG layer 602, which is wider than distance between the source layer 606 and the drain layer 610. Likewise, the portion of the CG layer 614 that contacts the SG layer 602 on the opposite side of the SG layer 602 can also extend the entire length of the SG layer 602. In various implementations, this gate terminal configuration can be referred to as a T-shape gate terminal.

Aside from these noted differences, the SG-FET 600 can comprise substantially same or similar materials, features and functionalities as SG-FET 400. For example, the SG-FET 600 can also be fabricated on or supported by a substrate (not drawn), such as but not limited to substrate comprising Si, sapphire, diamond, SiC, AlN, GaN, and the like. The source layer 606 and drain layer 610 can comprise doped semiconductors, such as Si, Ge, SiGe, ZnO, IGZO, GaAs, GaN, SiC, $MoS_2$, CNT and so on, but can also comprises metals, such as Ni, Au, Al, Cr and the like. In various implementations, the channel layer 608 comprises a semiconductor material, which can be the same as that of the source layer 606 and drain layer 610 (in implementations in which the source layer 606 and the drain layer 610 are formed with semiconductor materials). In another implementations, the channel layer 608 can be formed with other kinds of semiconductor materials, including but not limited to: Si, Ge, SiGe, ZnO, IGZO, GaAs, GaN, SiC, MoS2, CNT and so on. The channel layer 608 can be doped or un-doped, which as noted above, will influence the threshold voltage of the SG-FET 600 and determine whether the SG-FET is a D-mode or E-mode device. The channel layer 608 is electrically connected to the source layer 606 and drain layer 610. The gate dielectric layer 604 can comprise a single layer of insulator or semiconductor material or a combination of layers of insulators and/or semiconductors.

The SG layer 602 preferentially consists of a thin layer of moderately doped semiconductor formed over the channel layer 608 with gate dielectric layer 604 formed between the SG layer 602 and the channel layer 608. In some implementations, the material of the SG layer 602 can be the same as the material of the channel layer 608. In other implementations, the SG layer 602 can comprise various other semiconducting materials, including but not limited to: Si, Ge, SiGe, ZnO, IGZO, GaAs, GaN, SiC, MoS2, CNT and so on. The SG layer 602 is electrically connected to the gate electrode 612. The gate electrode 612 can be formed with a metal, heavily doped polysilicon or other heavily doped semiconductors.

In various implementations, the material of the CG layer 616 can be the same as the material as the gate electrode 612, but can also comprises other metals, other heavily doped polysilicon layers and/or other heavily doped semiconductors. The gate electrode 612 is located outside of the channel layer 608 (e.g., the gate electrode 612 should not be directly coupled with the channel layer 608 by electric-field effect). The voltage applied on gate electrode 612 influences the conductivity of the channel layer 608 indirectly through the SG layer 602 and the CG layer 616. To provide over-voltage protection, the SG layer 602 should have the same type of carriers as that of the channel layer 608 when active or otherwise in an ON-state (e.g., the type of carriers when the channel layer 608 is turned on to allow current to flow from the source layer 606, through the channel layer 608, and to the drain layer 610.

FIG. 7 presents another example SG-FET 700 in accordance with one or more fifth embodiments described herein. Two different views or perspectives of the SG-FET 700 are shown. View (a) provides a top view of the SG-FET 700, and View (b) provides a cross-sectional view of the SG-FET 700 (taken along the dashed line in View (a)).

SG-FET 700 can be considered a hybrid of SG-FET 500 and SG-FET 600. In this regard, similar to SG-FET 500 and SG-FET 600 (and other SG-FETs described herein), the SG-FET 700 includes a channel layer 708 with a source layer 706 and a drain layer 710 formed on opposite sides of the channel layer 708. The SG-FET 700 also includes a SG layer 702, a gate dielectric layer 704, a gate electrode 712, a CG layer 714 and a semiconductor layer 716. The SG layer 702, the gate dielectric layer 704, the source layer 706, the channel layer 708, the drain layer 710, the gate electrode 712, the CG layer 714, and the semiconductor layer 716 can comprise same or similar materials and/or provide same or features and functionalities as the corresponding components described with reference to SG-FET 100, SG-FET 400, SG-FET 500 and/or SG-FET 600. In this regard, the SG layer 702 can correspond to SG layer 102, 402, 502 and/or 602, the gate dielectric layer 704 can correspond to gate dielectric layer 104, 404, 504 and/or 604, the source layer 706 can correspond to the source layer 106, 406, 506 and/or 606, the channel layer 708 can correspond to the channel layer 108, 408, 508 and/or 608, the drain layer 710 can correspond to the drain layer 110, 410, 510 and/or 710, the gate electrode 712 can correspond to the gate electrode 112, 412, 512 and/or 712, the CG layer 714 can correspond to CG layer 414, 514 and/or 614, and the semiconductor layer 716 can correspond to semiconductor layer 516. Repetitive description of like elements employed in respective embodiments is omitted for sake of brevity.

With reference to FIG. 7 in view of FIG. 6, similar to SG-FET 600, the SG-FET 700 also includes a T-shape gate terminal, wherein the SG layer 702 is formed between the gate electrode 712 and the CG layer 714, and wherein the SG layer 702 is located entirely outside of the region between the source layer 706 and the drain layer 710. The CG layer 714 is electrically connected to the gate electrode 712 through the SG layer 702. With this configuration, the SG layer 702 can have a much wider and tunable length of contact with the gate electrode 712 and the CG layer 714 relative to the SG-FET 400. As a result, the SG-FET 700 has the advantage of further reduced gate resistance. For example, similar to SG-600, in the embodiment shown, the portion of the gate electrode 712 that contacts the SG layer 702 on one side of the SG layer 702 can extend the entire length of the SG layer 702, which is wider than distance between the source layer 706 and the drain layer 710. Likewise, the portion of the CG layer 714 that contacts the SG layer 702 on the opposite side of the SG layer 702 can also extend the entire length of the SG layer 702. Also similar to SG-FET 600, the CG layer 714 is formed on and/or covers the channel region 708 located between the source layer 706 and the drain layer 710.

Unlike SG-FET 600, the SG layer 702 is not formed over and/or does not cover an extended portion of the channel layer (e.g., extended portion 608') located outside of the region between the source layer 706 and the drain layer 710. On the contrary, similar to SG-FET 500, the SG layer 702 is formed over and covers a semiconductor layer 716 that is connected to the source layer 706 and that is physically separated/isolated from the channel layer 708. In this embodiment, unlike semiconductor layer 516 of SG-FET 500, the semiconductor layer 716 is located entirely outside the region between the source layer 706 and the drain layer 710. With this configuration, all possible electric paths from the gate electrode 712 to the CG layer 714 include flow through at least a part of the SG layer 702 which is formed above and covers the SG layer 702.

Aside from these noted differences, the SG-FET 700 can comprise substantially same or similar materials, features and functionalities as SG-FET 500 and SG-FET 600. For example, the SG-FET 700 can also be fabricated on or supported by a substrate (not drawn), such as but not limited to substrate comprising Si, sapphire, diamond, SiC, AlN, GaN, and the like. The source layer 706 and drain layer 710 can comprise doped semiconductors, such as Si, Ge, SiGe, ZnO, IGZO, GaAs, GaN, SiC, $MoS_2$, CNT and so on, but can also comprises metals, such as Ni, Au, Al, Cr and the like. In various implementations, the channel layer 708 comprises a semiconductor material, which can be the same as that of the source layer 706 and drain layer 710 (in implementations in which the source layer 706 and the drain layer 710 are formed with semiconductor materials). In another implementations, the channel layer 708 can be formed with other kinds of semiconductor materials, including but not limited to: Si, Ge, SiGe, ZnO, IGZO, GaAs, GaN, SiC, MoS2, CNT and so on. The channel layer 708 can be doped or un-doped, which as noted above, will influence the threshold voltage of the SG-FET 700 and determine whether the SG-FET is a D-mode or E-mode device. The channel layer 708 is electrically connected to the source layer 706 and drain layer 710. The gate dielectric layer 704 can comprise a homogenous layer of insulator or semiconductor material or a combination of layers of insulators and/or semiconductors.

The material of the semiconductor layer 716 could be the same as the channel layer 708, but could also be other kind of semiconductors, such as Si, Ge, SiGe, ZnO, IGZO, GaAs, GaN, SiC, $MoS_2$, CNT and so on. The SG layer 702 can comprise a thin layer (e.g., less than 10 nm) of moderately doped semiconductor, which is located on top of the semiconductor layer 716 and the gate dielectric layer 704. The material of the SG layer 702 can be the same as the channel layer 708, but can also include other thin-layer semiconductors, such as Si, Ge, SiGe, ZnO, IGZO, GaAs, GaN, SiC, $MoS_2$, CNT and so on. The SG layer 702 is electrically connected to the gate electrode 712. The gate electrode 712 can be formed with a metal, heavily doped polysilicon or other heavily doped semiconductors.

In various implementations, the material of the CG layer 714 can be the same as the material as the gate electrode 712, but can also comprises other metals, other heavily doped polysilicon layers and/or other heavily doped semiconductors. The material of the semiconductor layer 716 can be the same as the channel layer 708, but can also be other semiconductor, such as Si, Ge, SiGe, ZnO, IGZO, GaAs, GaN, SiC, $MoS_2$, CNT and so on. The semiconductor layer 716 can be doped or undoped, which can influence the clamped gate voltage of the device. The gate electrode 712 should be outside of the channel layer 708 and the semiconductor layer 716, (e.g., the gate electrode 712 should not be directly coupled with the channel layer 708 by electric-field effect). The voltage applied on gate electrode 712 influences the conductivity of the channel layer 708 and the semiconductor layer 716 indirectly through the SG layer 702 and the CG layer 714. To provide over-voltage protection, the SG layer 702 should have the same type of carriers as that of the channel layer 708 when active or otherwise in an ON-state (e.g., the type of carriers when the channel layer 708 is turned on to allow current to flow from the source layer 706, through the channel layer 708, and to the drain layer 710).

FIG. 8 presents another example SG-FET 800 in accordance with one or more sixth embodiments described herein. Two different views or perspectives of the SG-FET 800 are shown. View (a) provides a top view of the SG-FET 800, and View (b) provides a cross-sectional view of the SG-FET 800 (taken along the dashed line in View (a)).

Similar to other SG-FETs described herein (e.g., SG-FET 400), the SG-FET 800 includes a channel layer 808 with a source layer 806 and a drain layer 810 formed on opposite sides of the channel layer 808. The SG-FET 800 also includes a SG layer 802, a gate dielectric layer 804, and a gate electrode 812. The SG layer 802, the gate dielectric layer 804, the source layer 806, the channel layer 808, the drain layer 810, and the gate electrode 812 can comprise same or similar materials and/or provide same or features and functionalities as the corresponding components described with reference to SG-FET 100 (and other SG-FETs described herein. In this regard, the SG layer 802 can correspond to SG layer 102, the gate dielectric layer 804 can correspond to gate dielectric layer 104, the source layer 806 can correspond to the source layer 106, the channel layer 808 can correspond to the channel layer 108, the drain layer 810 can correspond to the drain layer 110, and the gate electrode 812 can correspond to the gate electrode 112. Repetitive description of like elements employed in respective embodiments is omitted for sake of brevity.

SG-FET 800 differs from other SG-FETs previously described with respect to the addition of a conductive coupling layer 818 and a second gate dielectric layer 820. SG-FET 800 also differs from other SG-FETs previously described with respect to the structural configuration/position of the SG layer 802, the channel layer 808, and the gate electrode 812 relative to one another. In the embodiment shown, the SG-FET 800 is divided into two parts. A first part includes the source layer 806 and the drain layer 810 with the channel layer 808 formed therebetween. The first part also includes the gate dielectric layer 804 formed above the channel layer 808. The second part of the SG-FET includes the SG layer 802 and the gate electrode, wherein the SG layer 802 is physically and electrically coupled to the gate electrode 812. The second gate dielectric layer 820 is formed over the SG layer 802. In the embodiment shown, the first part and the second part of the SG-FET are separated from one another and located in parallel. In this regard, as shown in View (a), the channel layer 808 is aligned with the SG layer 802. The conductive coupling layer 818 further physically and electrically connects the first part and the second part of the SG-FET 800 together via the gate dielectric layer 804 and the second gate dielectric layer 820. In this regard, the conductive coupling layer 818 if formed directly over the gate dielectric layer 804 and the second gate dielectric layer 820, wherein the gate dielectric layer 804 is located only over the channel layer 808, and wherein the second gate dielectric layer 820 is located only over the SG layer 802. With this configuration, unlike other SG-FETs previously described, the SG layer 802 is not located directly above the channel layer 808 (or a semiconductor layer such as semiconductor layer 516 or semiconductor layer 716) but is capacitively coupled with the channel layer 808 through a conducting coupling layer 818 and the second gate dielectric layer 820. In some implementations, the SG layer 802 of SG-FET 800 can be also be divided into two layers consisting of a SG layer and a CG layer (not shown).

In accordance with this sixth embodiment, the SG-FET 800 can also be fabricated on or supported by a substrate (not drawn), such as but not limited to substrate comprising Si, sapphire, diamond, SiC, AlN, GaN, and the like. The source layer 806 and drain layer 810 can comprise doped semiconductors, such as Si, Ge, SiGe, ZnO, IGZO, GaAs, GaN, SiC, MoS$_2$, CNT and so on, but can also comprises metals, such as Ni, Au, Al, Cr and the like. In various implementations, the channel layer 808 comprises a semiconductor material, which can be the same as that of the source layer 806 and drain layer 810 (in implementations in which the source layer 806 and the drain layer 810 are formed with semiconductor materials). In another implementations, the channel layer 808 can be formed with other kinds of semiconductor materials, including but not limited to: Si, Ge, SiGe, ZnO, IGZO, GaAs, GaN, SiC, MoS2, CNT and so on. The channel layer 808 can be doped or un-doped, which as noted above, will influence the threshold voltage of the SG-FET 800 and determine whether the SG-FET is a D-mode or E-mode device. The channel layer 808 is electrically connected to the source layer 806 and drain layer 810. The gate dielectric layer 804 can comprise a homogenous layer of insulator or semiconductor material or a combination of layers of insulators and/or semiconductors.

The material of the SG layer 802 could be the same as the channel layer 808, but could also be other thin-layer semiconductors, such as Si, Ge, SiGe, ZnO, IGZO, GaAs, GaN, SiC, MoS$_2$, CNT and so on. The SG layer 802 is electrically connected to the gate electrode 812. The gate electrode 812 can be metals, heavily doped polysilicon or other heavily doped semiconductors. The material of the conducting coupling layer 818 can be the same as the gate electrode 812, but can also be other metals, heavily doped polysilicon or other heavily doped semiconductors. The material of the second gate dielectric layer 820 can be the same as the (first) gate dielectric layer 804, but can also be a single layer of other insulator or semiconductor, or a combination of layers of other insulators and/or semiconductors. The voltage applied on gate electrode 812 influences the conductivity of the channel layer 808 indirectly through the SG layer 802, which further couples to the channel layer 808 through the conducting coupling layer 818. To provide over-voltage protection, the SG layer 802 should have the same type of carriers as that of the channel layer 808 when active or otherwise in an ON-state (e.g., the type of carriers when the channel layer 808 is turned on to allow current to flow from the source layer 806, through the channel layer 808, and to the drain layer 810).

Figure 9:
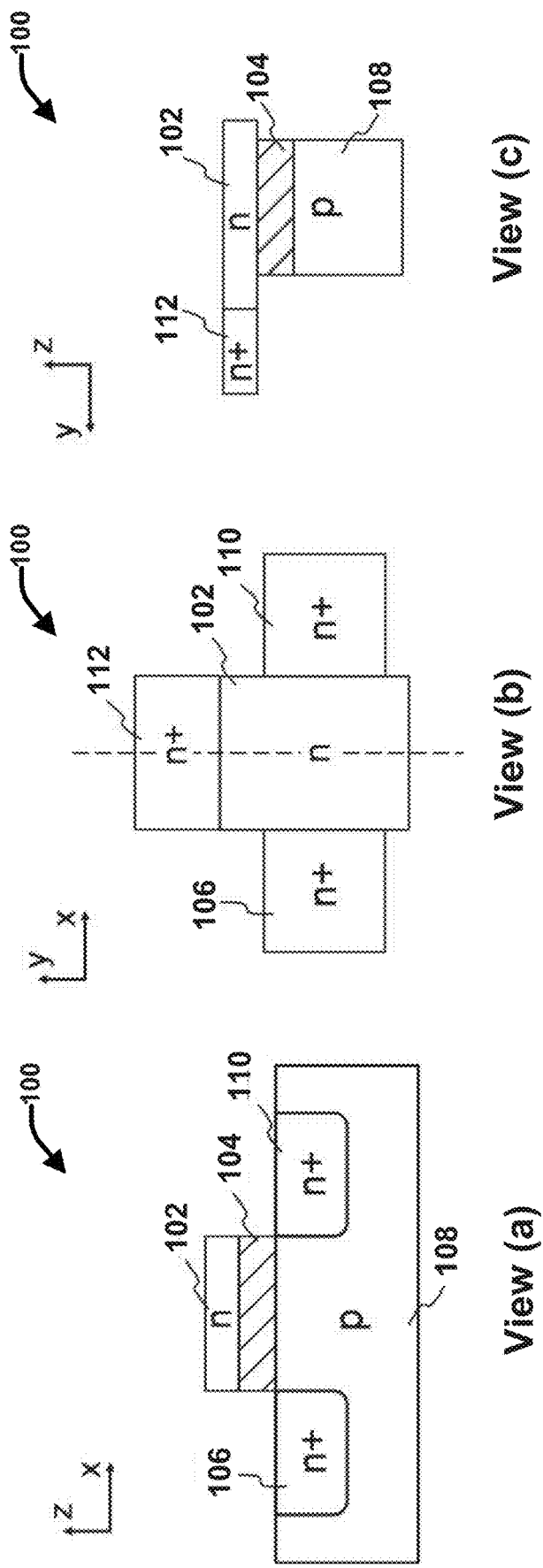
FIG. 9 presents an example implementation of an SG-FET in accordance with the one or more first embodiments described herein.

FIG. 9 presents an example implementation of SG-FET 100 in accordance with the one or more first embodiments described herein. Three different views or perspectives of the SG-FET 100 are shown which respectively correspond to the same views of SG-FET shown in FIG. 1. In this regard, View (a) provides a side view of the SG-FET 100, View (b) provides a top view of the SG-FET 100, and View (c) provides a cross-sectional view of the SG-FET 100 (taken along the dashed line in View (b)). Repetitive description of like elements employed in respective embodiments is omitted for sake of brevity.

With reference to FIG. 9 in view of FIG. 1, FIG. 9 presents an example implementation of SG-FET 100 based on the Si CMOS technology. In accordance with this example, the SG-FET 100 corresponds to an enhancement-mode n-channel FET. For example, in one implementation of SG-FET 100, N-type doped silicon can be used as the source layer 106 and the drain layer 110. P-type doped silicon can be used as the channel layer 108. The material of gate dielectric layer 104 can be silicon dioxide formed by thermal oxidation and/or high-k dielectric such as HfO$_2$, ZrO$_2$, HfZrO$_2$ and so on. A thin layer of n-type silicon is used as the SG layer 102. Alternatively, other n-type semiconductors can be used as the SG layer 102, such as Si, Ge, SiGe, ZnO, IGZO, GaAs, GaN, SiC, MoS$_2$, CNT and so on. The n-type SG layer 102 is connected to the gate electrode 112 can comprise heavily doped n-type silicon or other heavily doped n-type semiconductors or metals. In accordance with this example implementation, the SG-FET 100 is an n-type FET. In various implementations, the carrier type doping of all the elements (e.g., the SG layer 102, the gate dielectric layer 104, the source layer 106, the channel layer 108, the drain layer 110 and the gate electrode 112) shown in FIG. 9 can be switched between n-type and p-type, to make the SG-FET 100 p-type FET with a semiconducting gate, which also possesses the inherent over-voltage protection capability.

Figure 10:
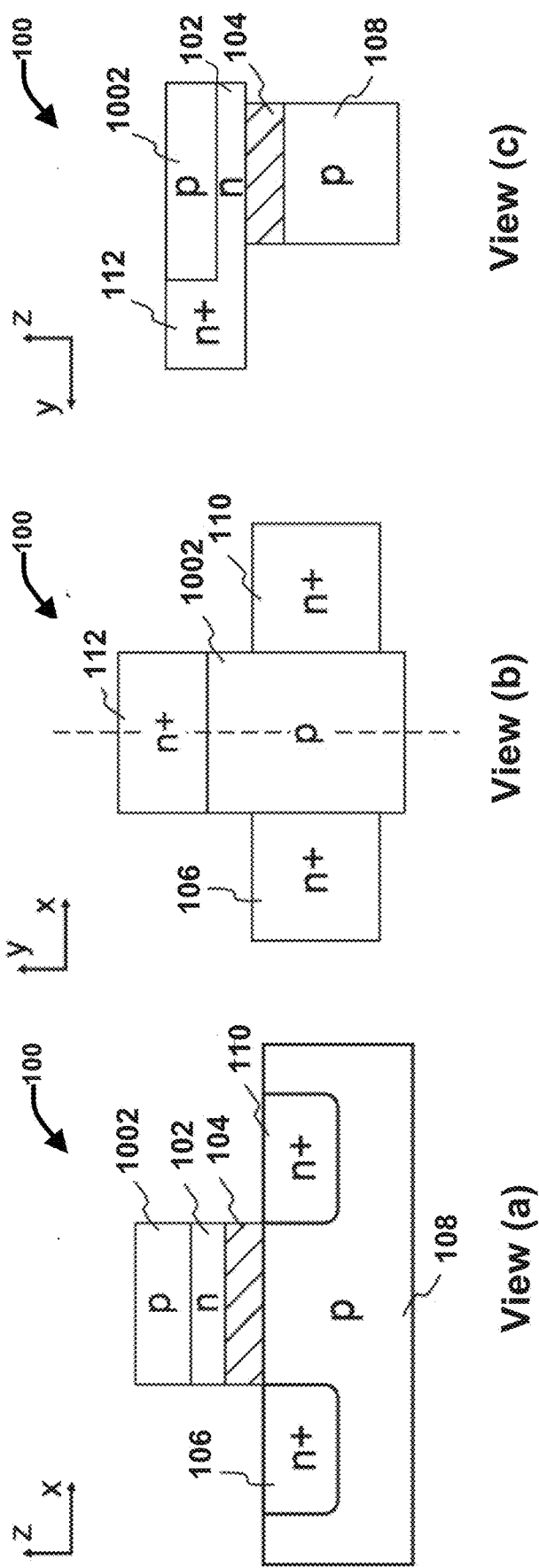
FIG. 10 presents another example implementation of an SG-FET in accordance with the one or more first embodiments described herein.

FIG. 10 presents another example implementation of an SG-FET 100 in accordance with the one or more first embodiments described herein. Three different views or perspectives of the SG-FET 100 are shown which respectively correspond to the same views of SG-FET shown in FIG. 1. In this regard, View (a) provides a side view of the SG-FET 100, View (b) provides a top view of the SG-FET 100, and View (c) provides a cross-sectional view of the SG-FET 100 (taken along the dashed line in View (b)). Repetitive description of like elements employed in respective embodiments is omitted for sake of brevity.

With reference to FIG. 10 in view of FIG. 1, FIG. 10 presents an example implementation of SG-FET 100 based on the Si CMOS technology. In accordance with this example, the SG-FET 100 corresponds to an enhancement-mode FET. For example, in the embodiment shown, N-type doped silicon can be used as the source layer 106 and the drain layer 110. P-type doped silicon can be used as the channel layer 108. The material of gate dielectric layer 104 can be silicon dioxide formed by thermal oxidation and/or high-k dielectric such as HfO$_2$, ZrO$_2$, HfZrO$_2$ and so on. A thin layer of n-type silicon is used as the SG layer 102. Alternatively, other n-type semiconductors can be used as the SG layer 102, such as Si, Ge, SiGe, ZnO, IGZO, GaAs, GaN, SiC, MoS$_2$, CNT and so on.

Different from the example implementation shown in FIG. 9, in accordance with this embodiment, the SG-FET 100 further includes a p-type semiconductor layer 1002 above the n-type SG layer 102. The material of the p-type semiconductor layer 1002 is preferred to be the same as the SG layer 102. The addition of the p-type semiconductor layer 1002 over the n-type SG layer 102 with the same material as the n-type SG layer 102 can help to reduce surface scattering of carriers inside the SG layer 102. The material of the semiconductor layer 1002 can also be other semiconductors, such as Si, Ge, SiGe, ZnO, IGZO, GaAs, GaN, SiC, MoS$_2$, CNT and so on. The n-type SG layer 102 and the p-type semiconductor layer 1002 are respectively connected to a gate electrode 112. The gate electrode 112 could be heavily doped n-type silicon or other heavily doped n-type semiconductors or metals.

In accordance with this example implementation, the SG-FET 100 is an n-type FET. In various implementations, the carrier type doping of all the elements (e.g., the SG layer 102, the gate dielectric layer 104, the source layer 106, the channel layer 108, the drain layer 110 and the gate electrode 112 and the semiconductor layer 1002) shown in FIG. 10 can be switched between n-type and p-type, to make the SG-FET 100 p-type FET with a semiconducting gate, which also possesses the inherent over-voltage protection capability.

FIG. 11 presents an example implementation of an SG-FET 1100 based on the AlGaN/GaN HEMT technology in accordance with the one or more first embodiments described herein. FIG. 11 presents a side view (View (a)), and a top view (View (b)) of the SG-FET 1100. In one or more embodiments SG-FET 1100 can be or correspond to SG-FET 100, and vice versa. Repetitive description of like elements employed in respective embodiments is omitted for sake of brevity.

Similar to other SG-FETs described herein, the SG-FET 1100 can include an internal gate over voltage protection capability embedded within the gate terminal. In this regard, the SG-FET 1100 can include same or similar features and functionalities as SG-FET 100. For example, as shown in View (b), similar to SG-FET 100, the SG-FET 1100 can include an SG layer 1102 formed over a channel layer 1108, wherein the channel layer 1108 is formed between a source layer 1106 and a drain layer 1110. The SG-FET 1100 further includes a gate electrode 1112 electrically coupled to the SG layer 1102. Similar to SG-FET 100 (and other SG-FETs) described herein, the SG layer 1102 controls the flow of carriers through the channel layer 1108 from the source layer 1106 to the drain layer 1110 in response to application of a voltage to the gate electrode 1112. In this regard, the SG layer 1102 can include same or similar materials, features and functionalities as the SG layer 102 to provide the internal gate over voltage protection function as described with reference to SG layer 102 and FIG. 1. For example, the SG layer 1102 can be formed with one or more layers of a semiconductor material with a concentration of carriers that is based on the maximum effective gate voltage of the SG-FET 1100. In particular, the SG layer 1102 can have a doping or carrier concentration such that the maximum effective gate voltage of the gate terminal (e.g., the gate electrode 1112 and/or the SG layer 1102) is clamped to the depletion threshold of the SG layer 1102. For example, the SG layer 1102 can have a carrier concentration that is known to become completely depleted or substantially depleted (e.g., relative to a defined depletion threshold such as 90% or greater, 95% or greater, 98% or greater, etc.), in response to application of a voltage to the gate electrode 1112, and consequently the SG layer 1102 electrically coupled thereto, that is greater than or equal to the absolute value of the effective gate voltage ($V_H$).

In one or more embodiments, the SG-FET 1100 can be or include a HEMT that employs a heterostructure with at two layers of different materials having different band gaps. With these embodiments, a 2DEG layer (not shown) formed at the heterojunction between the different material layers can be formed within the channel layer 1108 and serve as the active channel when the SG-FET 1100 is turned on.

For example, as shown with reference to View (a) the SG-FET 1100 can include a stacked structure comprising a nucleation/buffer layer 1103, a channel layer 1108 formed on the nucleation/buffer layer, and a barrier layer 1101 formed on the channel layer. In this regard, the channel layer 1108 can be formed between the nucleation/buffer layer 1103 and the barrier layer. The respective materials of the nucleation/buffer layer 1103, the channel layer 1108 and the barrier layer 1101 can include various high-mobility materials with different band gaps (in accordance with HEMT operation principles). In one or more embodiments, the SG-FET 1100 can employ an AlGaN/GaN heterostructure. Although not shown, the SG-FET can be fabricated on a suitable substrate consisting silicon, sapphire, diamond, SiC, AlN, GaN and the like.

For example, in one example implementation, the SG-FET 1100 can be an n-type depletion mode (D-Mode) HEMT with an AlGaN/GaN heterostructure employing a single-layer of $MoS_2$ as the SG layer 1102. In accordance with this implementation, the source layer 1106 and the drain layer 1110 are preferred to be one or combination of Ti, Al, Ni, and Au, which can form ohmic contact with the channel layer 1108. The SG layer 1102 is preferred to a single layer of the layered two-dimensional semiconductors, such as a single layer of $MoS_2$. The SG layer 1102 can also be formed with one or more layers of $WSe_2$, $WS_2$, black phosphorus and so on. The channel layer 1108 can comprise GaN and the nucleation/buffer layer 1103 could be AlN, GaN, AlGaN and so on. The barrier layer 1101 can comprise AlGaN, which could also further include an AlN spacer layer and a GaN cap layer.

For example, in one implementation of this embodiment, the nucleation/buffer layer 1103 and the channel layer 1108 can collectively include 4.0 μm of GaN, and the barrier layer 1101 can include 23.5 nm of AlGaN, including 1.5 nm of AlN, 20.0 nm AlGaN and a 2.0 nm GaN cap. The SG layer 1102 can comprise a single-layer of $MoS_2$ with a thickness of about 0.65 nm. The SG-FET 1100 can further include a passivation layer (not shown) deposited over the entire device to passivate the device. For example, the passivation layer can be zirconium comprise dioxide ($ZrO_2$) and/or di-aluminum trioxide ($Al_2O_3$) or the like. In one example implementation, the passivation layer (not shown) can include 5.0 nm of ZrO2 and 15.0 nm of $Al_2O_3$ deposited on top of the entire device by atomic layer deposition (ALD). In accordance with this example implementation, owing to the spontaneous polarization of the channel layer 108 and the barrier layer 1101, two-dimensional electron gas (2DEG) is formed in the channel layer 1108 near the interface between the channel layer 1108 and the barrier layer 1101.

Figure 12:
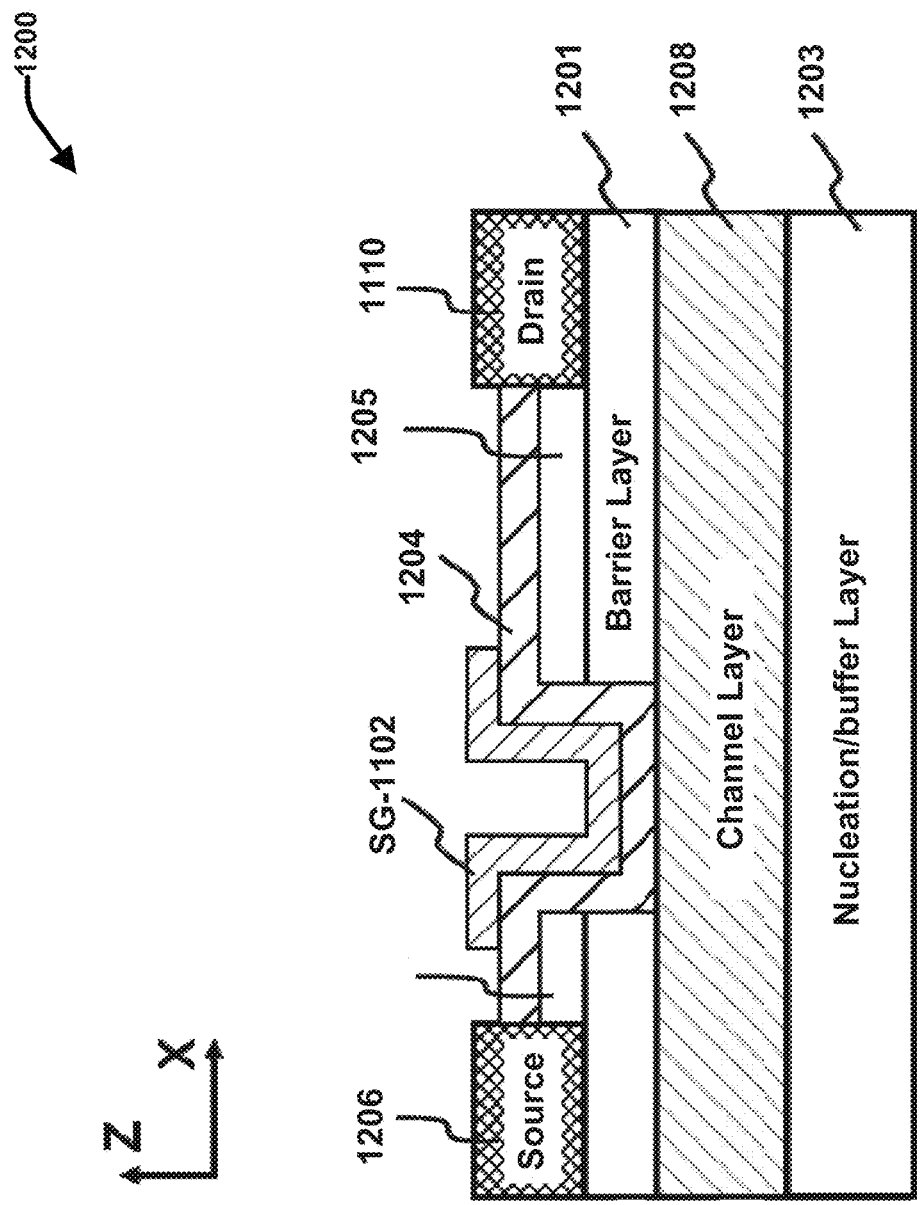
FIG. 12 presents an example implementation of an SG-FET based on the AlGaN/GaN enhancement mode (E-mode) HEMT technology in accordance with the one or more first embodiments described herein.

FIG. 12 presents an example implementation of an SG-FET 1200 based on the AlGaN/GaN enhancement mode (E-mode) high electron mobility transistor (HEMT) technology in accordance with the one or more first embodiments described herein. Repetitive description of like elements employed in respective embodiments is omitted for sake of brevity.

The SG-FET 1200 can include same or similar features as SG-FET 1100. In one or more embodiments, the SG-FET 1200 is an E-mode n-type HEMT. In accordance with this embodiment, the SG-FET includes a source layer 1206, a drain layer 1210, a channel layer 1208, a gate dielectric layer 1204, a SG layer 1202, a barrier layer 1201, a nucleation/buffer layer 1203 and a passivation layer 1205. The source layer 1206 and the drain layer 1210 are preferred to be one or a combination of Ti, Al, Ni, and Au, which can form ohmic contact with the channel layer 108. The channel layer 108 is GaN. The gate dielectric layer 1204 could be AlN, SiNx, $Al_2O_3$ and so on. The SG layer 102 can be an n-type semiconductor, such as (but not limited to), Si, Ge, SiGe, ZnO, IGZO, GaAs, GaN, SiC, $MoS_2$, CNT and so on. The barrier layer 1201 is AlGaN, which could also further include an AlN spacer layer and a GaN cap layer. The nucleation/buffer layer 103 could be AlN, GaN, AlGaN and so on. The passivation layer 105 could be AlN or SiNx. Owing to the spontaneous polarization of the channel layer 108 and the barrier layer 1201, two-dimensional electron gas (2DEG) is formed in the channel layer 1208 near the interface between the channel layer 1208 and the barrier layer 1201. Part of the barrier layer 1201 located directly under the SG layer 1202 is recessed in order to fabricate enhancement-mode device.

Figure 13:
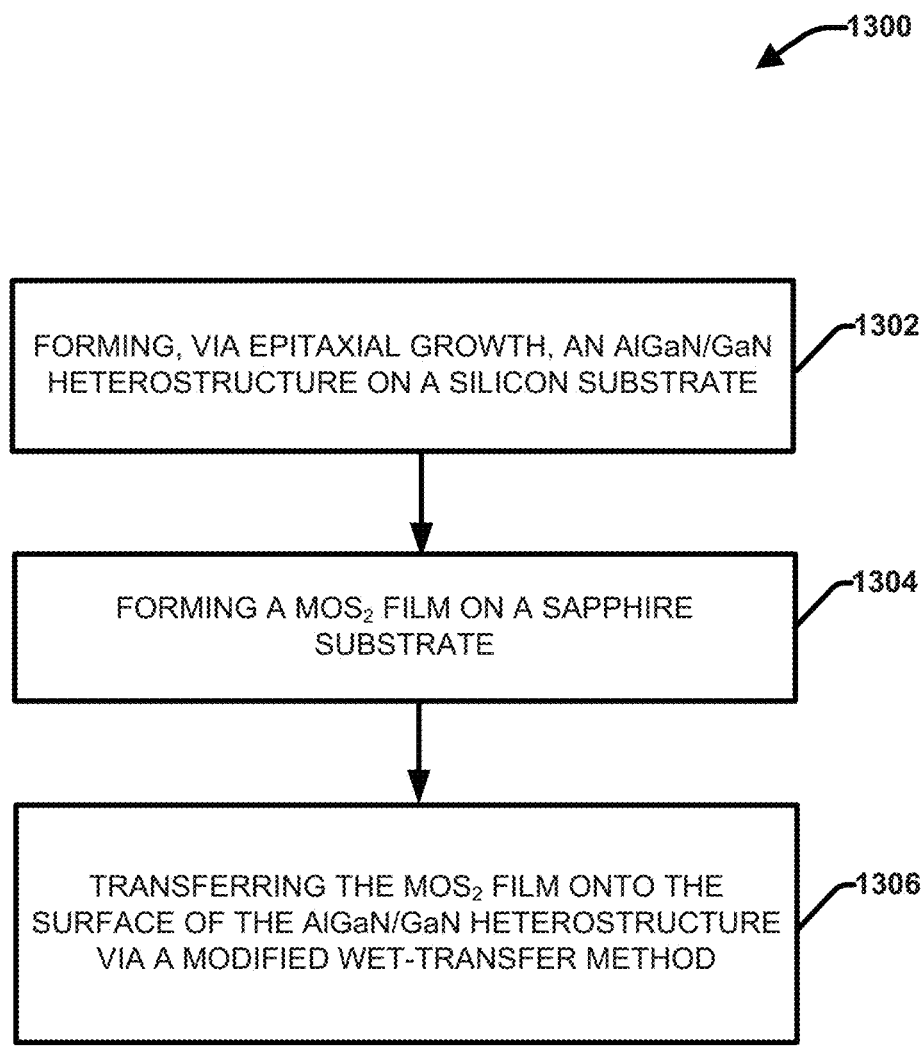
FIG. 13 presents a high-level flow diagram of an example method for forming a SG-FET in accordance with various aspects and embodiments described herein.

FIG. 13 presents a high-level flow diagram of an example method 1300 for forming a SG-FET in accordance with various aspects and embodiments described herein. In various embodiments, method 1300 can be employed to form SG-FET 1100 and/or SG-FET 1200. Repetitive description of like elements employed in respective embodiments is omitted for sake of brevity.

In this regard, with reference to FIG. 13 in view of FIGS. 11 and 12, at 1302, an AlGaN/GaN heterostructure can be formed on a silicon substrate via epitaxial growth. In one embodiment, the heterostructure can include a first layer of 4.0 μm of GaN (e.g., the nucleation/buffer layer and channel layer) grown on the silicon substrate. The heterostructure can further include a second layer (e.g., barrier layer) grown on the first layer and comprising 1.5 nm of AlN, 20.0 nm AlGaN and a 2.0 nm GaN cap. At 1304, an $MoS_2$ film can be formed on a sapphire substrate (e.g., via epitaxial growth). At 1306, an $MoS_2$ film can then be transferred onto the surface of the AlGaN/GaN heterostructure (e.g., on and adjacent to the barrier layer) via a modified wet-transfer method.

Figures 14A, 14B:
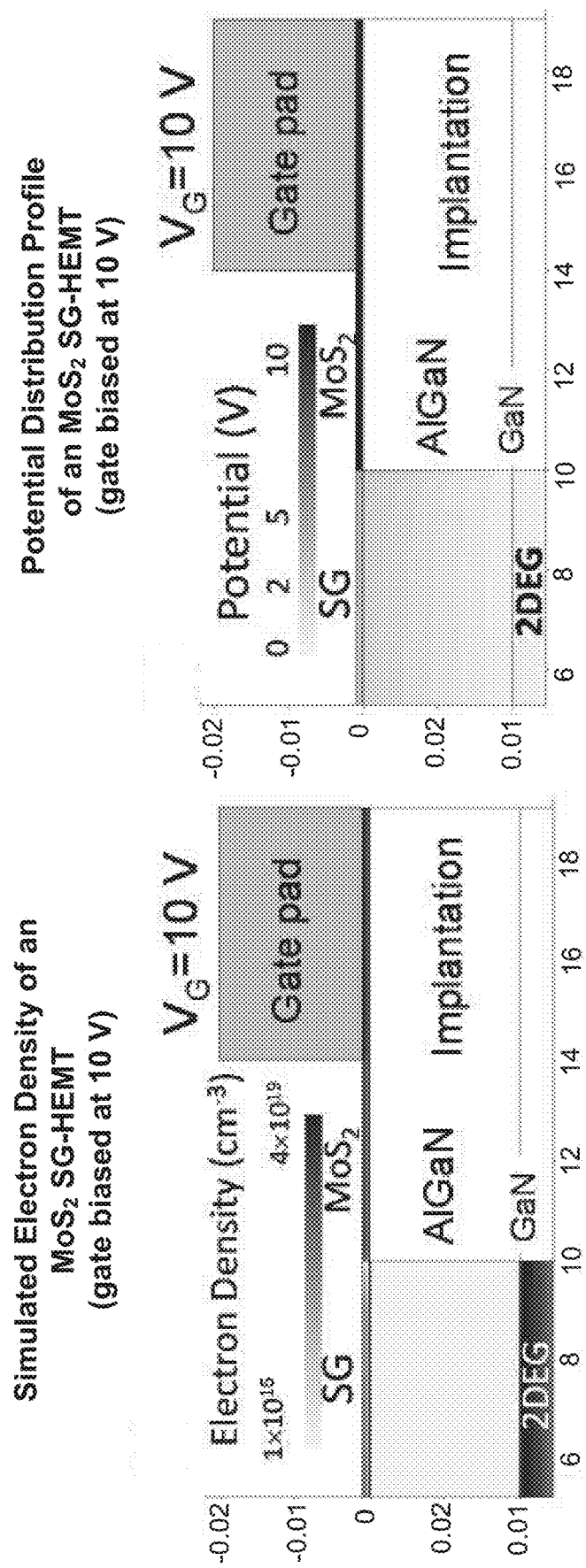
FIG. 14A provides a graph demonstrating the simulated electron density distribution along the gate width direction of the AlGaN/GaN HEMT with single-layer $MoS_2$ as semiconducting gate in accordance with one or more embodiments described herein.
FIG. 14B provides a graph demonstrating the simulated potential distribution along the gate width direction of the AlGaN/GaN HEMT with single-layer $MoS_2$ as semiconducting gate in accordance with one or more embodiments described herein.

FIG. 14A provides a graph demonstrating the simulated electron density distribution along the gate width direction of an AlGaN/GaN HEMT with single-layer $MoS_2$ as semiconducting gate in accordance with one or more embodiments described herein. FIG. 14B provides a graph demonstrating the simulated potential distribution along the gate width direction of the AlGaN/GaN HEMT with single-layer $MoS_2$ as semiconducting gate in accordance with one or more embodiments described herein.

As shown in FIG. 14A, depletion of the $MoS_2$ SG is observed at a large forward gate bias, especially at the 2DEG channel layer edge. For example, the $MoS_2$ SG has a depletion threshold voltage of 2.0 V, and the semiconducting gate electrode is biased at 10.0 V. Thus, as shown in the simulation, the $MoS_2$ SG becomes depleted as the forward gate bias exceeds 2.0 V, and becomes completely (or substantially depleted) at 10.0 V. As shown in FIG. 14B, the potential above the 2DEG channel layer is clamped to the threshold voltage of $MoS_2$ SG, with the potential drop mainly occurring at the $MoS_2$ SG near the edge of the 2DEG channel layer. In this regard, the effective gate voltage is clamped to the depletion threshold voltage of $MoS_2$ SG (or vice versa), with the excessive gate stress being sustained by the $MoS_2$ SG at the channel layer edge.

Figure 15B:
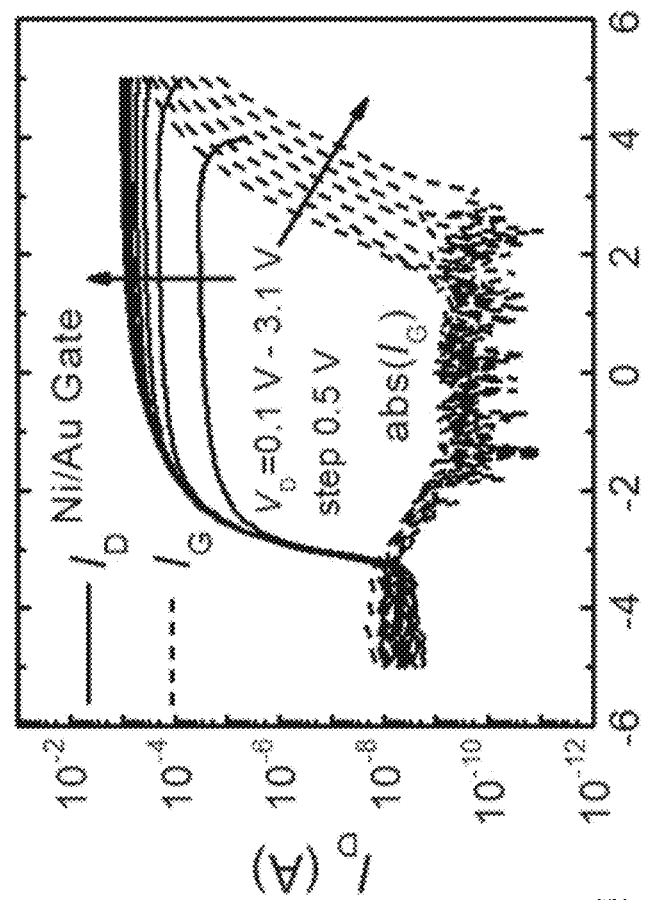
FIG. 15B provides a comparison graph depicting the transfer curves and gate leakages of an AlGaN/GaN HEMT with Ni/Au as the gate in accordance with aspects and embodiments described herein.
Figure 15A:
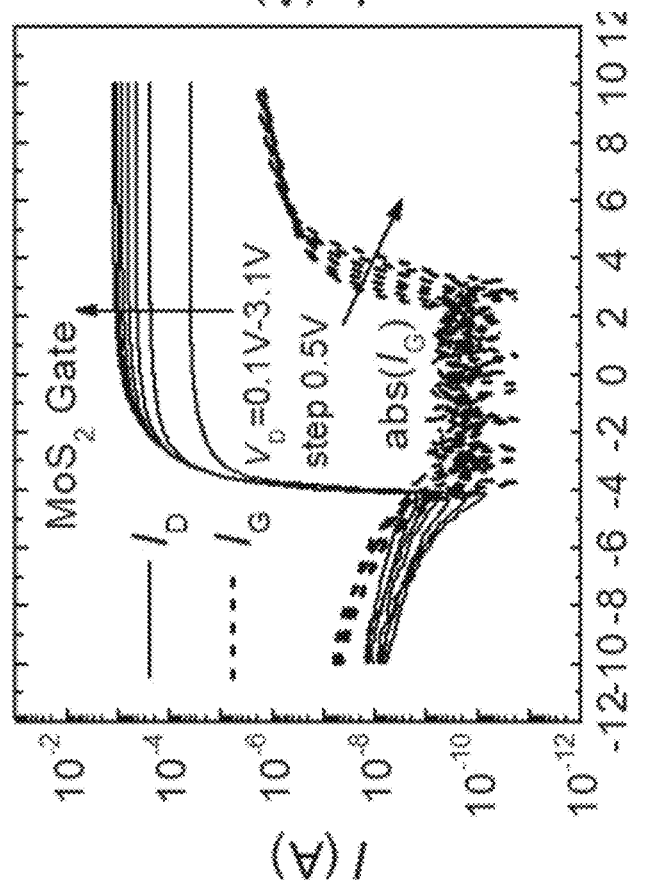
FIG. 15A provides a graph depicting the transfer curves and gate leakages of an AlGaN/GaN HEMT with single-layer $MoS_2$ as semiconducting gate in accordance with aspects and embodiments described herein.

FIG. 15A provides a graph depicting the transfer curves and gate leakages of an AlGaN/GaN HEMT with single-layer $MoS_2$ as semiconducting gate in accordance with aspects and embodiments described herein. FIG. 15B provides a comparison graph depicting the transfer curves and gate leakages of an AlGaN/GaN HEMT with Ni/Au as the gate in accordance with aspects and embodiments described herein.

FIG. 15A further shows the transfer curves of the $MoS_2$ SG-HEMT with the 2DEG as the back gate when the 2DEG voltage has already been inverted. These transfer curves are represented by the solid lines with open circles. In this regard, the $MoS_2$-channel layer FET voltage can also be measured by using the using the 2DEG channel layer as the back gate. As shown by these transfer curves, it is observed that the $MoS_2$-SG can be depleted as the $MoS_2$-to-2DEG voltage (i.e. $V_G$) exceeds 2.0 V, at which the 2DEG channel layer (with a threshold voltage of −4.0 V) is already sufficiently turned on. The forward gate leakage saturation demonstrated in FIG. 15A also correlates with the depletion of the $MoS_2$-SG, which suggests that the semiconducting nature of the $MoS_2$-SG is the key to the gate leakage suppression. The large forward gate bias not only turns on the device channel layer, but also gradually depletes the $MoS_2$-SG.

Some of the graphs shown in FIG. 15B also compare the performance characteristics of the $MoS_2$ SG-HEMT to an MG-FET having the same structure and materials as the $MoS_2$ SG-HEMT with the exception of replacement of the SG 402 with a Schottky metal gate (MG) comprising nickel (Ni) and gold (Au), (e.g., an Ni/Au Schottky MG). An MG-FET having this structure is generally referred to as Ni/Au MG-HEMT. The performance characteristics of both the $MoS_2$ SG-HEMT and the Ni/Au MG-HEMT reflect both devices having respective AlGaN/GaN heterostructure layers with the thicknesses described above (e.g., 4.0 μm of GaN for the nucleation/buffer and channel layer and a barrier layer comprising 1.5 nm of AlN, 20.0 nm AlGaN and a 2.0 nm GaN cap). The performance characteristics of both the $MoS_2$ SG-HEMT and the Ni/Au MG-HEMT also reflect inclusion of a $ZrO_2/Al_2O_3$ passivation layer formed over the entire device. The performance characteristics of both the $MoS_2$ SG-HEMT and the Ni/Au MG-HEMT further reflect the respective devices having a gate length ($L_g$) of 10 μm, a gate-drain layer distance ($L_{gd}$) of 5.0 μm, and a gate-source distance ($L_{gs}$) of 5.0 μm.

As shown in FIG. 15B, the Ni/Au MG-HEMT shows a large forward gate leakage, once the forward gate bias exceeds 1.5 Volts (V). Thus, severe gate degradation and failure of the Ni/Au MG-HEMT can be easily induced with a gate over-voltage stress. In contrast, as shown in FIG. 6A, the $MoS_2$ SG-HEMT exhibits suppressed gate leakage at a large forward gate bias (e.g., 1.5 V or greater). Moreover, a saturation of the forward gate leakage is obtained, which allows a much larger gate swing (e.g., from at least −10 V to 10 V) for the $MoS_2$ SG-HEMT relative to the Ni/Au MG-HEMT.

Figure 16A:
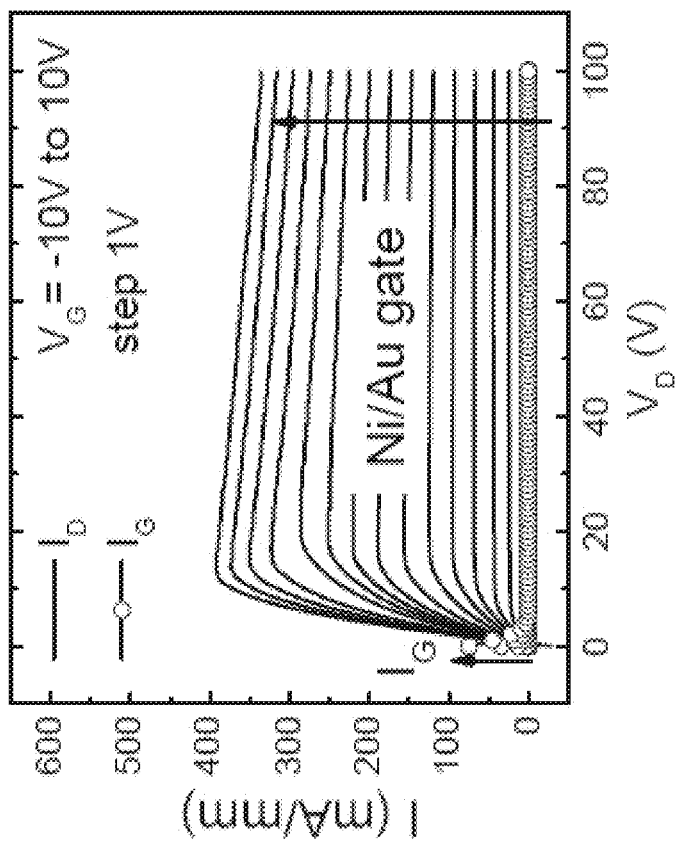
FIG. 16A provides a graph demonstrating the output curves of an AlGaN/GaN HEMT with single-layer $MoS_2$ as semiconducting gate in accordance with one or more embodiments described herein.
Figure 16B:
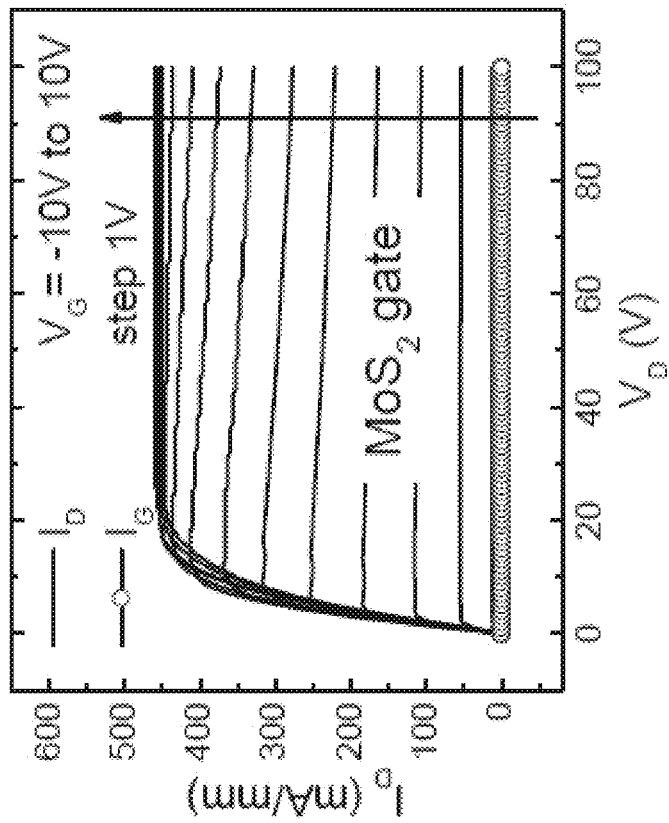
FIG. 16B provides a graph demonstrating the output curves of an AlGaN/GaN HEMT with Ni/Au as the gate in accordance with one or more embodiments described herein.

FIGS. 16A and 16B provide graphs demonstrating the output characteristics of an $MoS_2$ SG-HEMT and an Ni/Au MG-HEMT, respectively, in accordance with one or more embodiments described herein. The output curves are measured after device passivation (for both devices). As shown via comparison of output characteristics of both devices, the drive current of both devices is substantially the same. $MoS_2$ SG-HEMT even shows a boosted ON-current. In this regard, no sacrifice of the ON current is observed for $MoS_2$ SG-HEMT. In fact, the $MoS_2$ SG-HEMT even demonstrates a slightly larger ON current relative to the Ni/Au MG-HEMT. Thus, the $MoS_2$ SG shows no penalty to the drive current of the $MoS_2$ SG-HEMT.

Figures 17A, 17B:
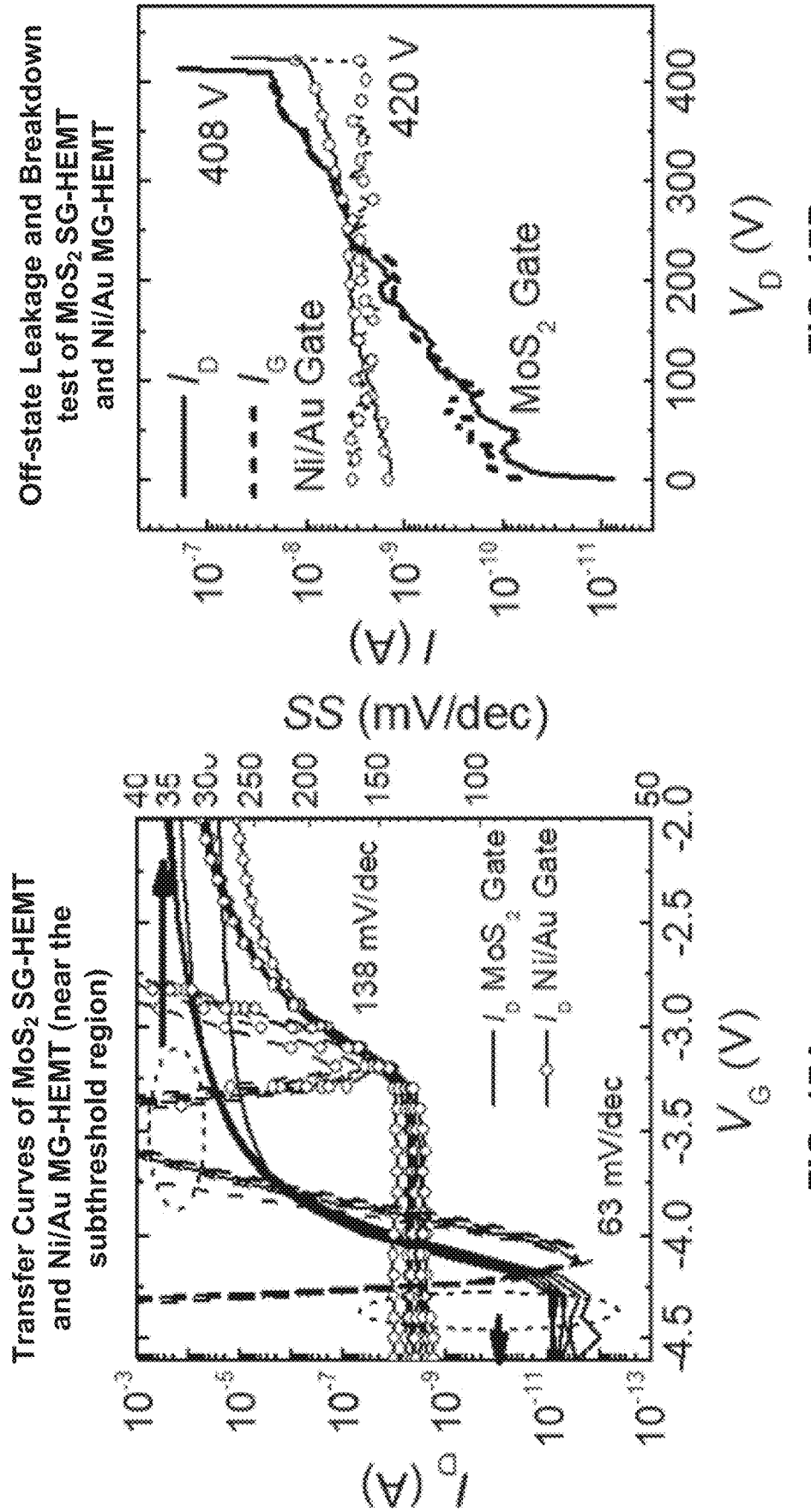
FIG. 17A provides a graph that compares the subthreshold swing of an AlGaN/GaN HEMTs with a Ni/Au metal gate and MoS$_2$ semiconducting gate in accordance with one or more embodiments described herein.
FIG. 17B provides a graph that compares the off-state leakage and breakdown test of an AlGaN/GaN HEMTs with a Ni/Au metal gate and MoS$_2$ semiconducting gate in accordance with one or more embodiments described herein.

FIG. 17A provides a graph that compares the subthreshold swing of an AlGaN/GaN HEMTs with a Ni/Au metal gate and $MoS_2$ semiconducting gate in accordance with one or more embodiments described herein. FIG. 17B provides a graph that compares the off-state leakage and breakdown test of an AlGaN/GaN HEMTs with a Ni/Au metal gate and $MoS_2$ semiconducting gate in accordance with one or more embodiments described herein.

As shown in FIG. 17A, the transfer curves (solid lines) of $MoS_2$ SG-HEMT and the Ni/Au MG-HEMT near the sub-threshold region. The $MoS_2$ SG-HEMT has a lower off-state current and a smaller subthreshold swing (dashed lines) relative to the Ni/Au MG-HEMT. For example, as shown in FIG. 17A, The $MoS_2$ SG maintains its conductivity during the turn-off of the 2DEG channel layer, thus a subthreshold swing (SS) as low as 63 mV/dec and high ON/OFF current ratio of $10^9$ are obtained for the $MoS_2$ SG-HEMT. In comparison, as shown in FIG. 17B, both the $MoS_2$ SG-HEMT and the Ni/Au MG-HEMT demonstrate substantially the same breakdown voltage. Thus, usage of the $MoS_2$ SG as opposed to Ni/Au MG does not negatively impact the device breakdown voltage.

Figure 18:
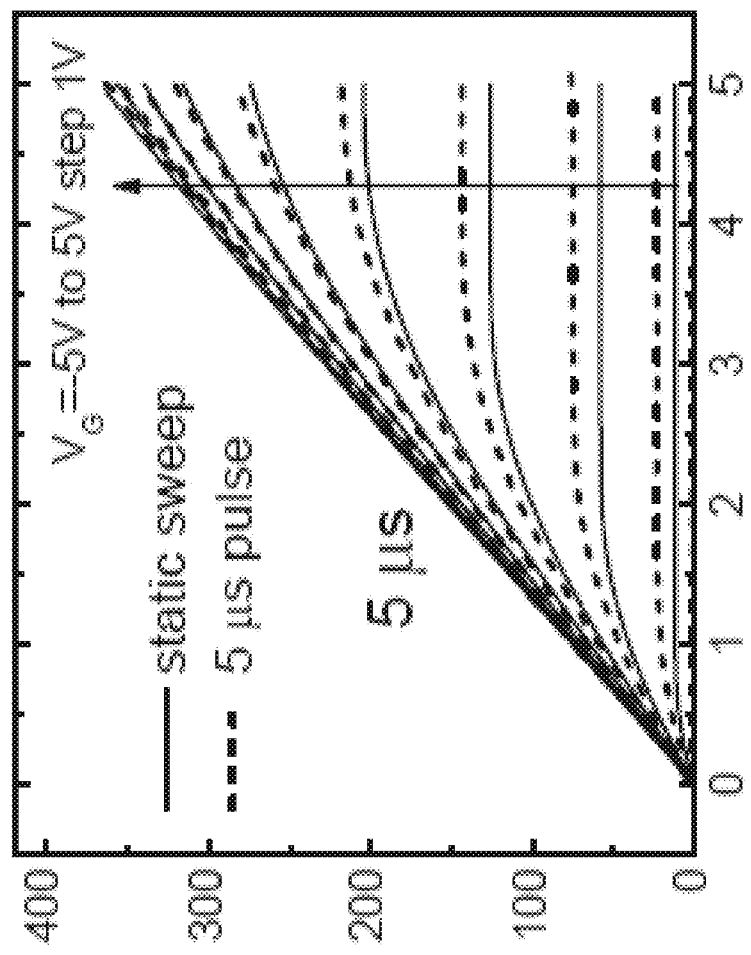
FIG. 18 provides a graph demonstrating the fast switching output curves of an example SG-HEMT in accordance with one or more embodiments described herein.

FIG. 18 provides a graph demonstrating the fast switching output curves of an example MoS$_2$ SG SG-HEMT in accordance with one or more embodiments described herein. In this regard, FIG. 10 shows the pulsed I-V characteristics of the MoS$_2$ SG SG-HEMT. As shown in FIG. 10, the MoS$_2$ SG SG-HEMT can at least respond to 5-μs fast switching. The main bottlenecks of the switching speed are attributed to the low carrier mobility (6 cm$^2$/V·s) and the large contact resistance (100 Ω·mm) of the MoS$_2$ semiconductor material, both of which can be further optimized, such as by adopting other high-mobility two-dimensional semiconductor materials as the SG or using SG only at the channel layer edge.

In summary, a SG is disclosed for the FET to achieve inherent gate overvoltage protection, without any additional protection circuits. The disclosed SG-FET has been demonstrated on an AlGaN/GaN HEMT with a single-layer of MoS$_2$ as the SG. This MoS$_2$ SG-HEMT shows no penalties to the 2DEG channel layer turn-on, ON-state driving current, and the breakdown voltage. More importantly, when a large forward voltage is applied on the SG, not only does it turn on the device by increasing the channel layer carrier density, it also depletes the SG, owing to the semiconductor nature of the SG. As a result, the SG can clamp the effective gate voltage to the depletion threshold voltage of the SG, which provides an inherent gate over-voltage protection for FET. Furthermore, by adopting channel layer edge SG, the SG-FET can maintain the capability of current scaling and highspeed switching.

What has been described above includes examples of various embodiments of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A field-effect transistor, comprising: a source layer: a drain layer: a channel layer formed between the source layer and the drain layer: and a semiconducting gate layer coupled to the channel layer, the semiconducting gate layer being entirely depletable and having no capacitive coupling to capacitive coupling to a gate layer having a higher conductivity relative to the semiconducting gate layer.

2. The field-effect transistor of claim 1, wherein the semiconducting gate layer has a same carrier type as the channel layer and has a maximum effective gate voltage that is clamped to a depletion threshold of the semiconducting gate layer.

3. The field-effect transistor of claim 1, wherein the semiconducting gate is formed over the channel layer and wherein the field-effect transistor further comprises:
a gate dielectric layer or one or more barrier layers formed between the channel layer and the semiconducting gate.

4. The field-effect transistor of claim 3, further comprising:
a silicon substrate; and
a heterostructure comprising a first layer of gallium nitride (GaN) formed on and adjacent to the silicon substrate, and a second layer of aluminum gallium nitride (AlGaN) formed on and adjacent to the first layer as barrier layer, and wherein the semiconducting gate layer is formed on the heterostructure and wherein the channel layer comprises a two-dimensional electron gas formed at a heterojunction between the first layer and the second layer.

5. The field-effect transistor of claim 1, further comprising:
a gate electrode comprising the gate layer, wherein the gate electrode is formed without overlying the channel layer, wherein the gate electrode is not capacitively coupled the channel layer, and wherein the gate electrode is electrically connected to the semiconducting gate layer.

6. The field-effect transistor of claim 5, further comprising:
a conducting gate layer electrically connected to the gate electrode through a portion of the semiconducting gate layer.

7. The field-effect transistor of claim 6, further comprising:
an extended portion of the channel layer that extends outside an area between the source layer and the drain layer, wherein the semiconducting gate layer further overlies the extended portion of the channel layer.

8. The field-effect transistor of claim 6, further comprising:
an extended portion of the channel layer that extends outside an area between the source layer and the drain layer but is physically separated from the channel layer, wherein the semiconducting gate layer further overlies the extended portion of the channel layer.

9. The field-effect transistor of claim 1, wherein the source layer and the drain layer respectively comprise a material or materials selected from a group of heavily doped semiconductors and metals: silicon (Si), germanium (Ge), silicon germanium (SiGe), zinc oxide (ZnO), indium gallium zinc oxide (IGZO), gallium arsenide (GaAs), gallium nitride (GaN), silicon carbide (SiC), molybdenum disulfide (MoS$_2$), carbon nanotube (CNT), titanium (Ti), copper (Cu), titanium (Ti), nickel (Ni), gold (Au), aluminum (Al), chromium (Cr).

10. The field-effect transistor of claim 1, wherein the semiconducting gate layer comprises a single layer of material selected from a group of lightly doped semiconductors, such as: silicon (Si), germanium (Ge), silicon germanium (SiGe), zinc oxide (ZnO), indium gallium zinc oxide (IGZO), gallium arsenide (GaAs), gallium nitride (GaN), silicon carbide (SiC), molybdenum disulfide ($MoS_2$), and carbon nanotube (CNT).

11. The field-effect transistor of claim 1, wherein the semiconducting gate layer is formed with monolayer molybdenum disulfide ($MoS_2$).

12. The field-effect transistor of claim 1, wherein the semiconducting gate layer comprises a single layer of monolayer molybdenum disulfide ($MoS_2$).

13. A field-effect transistor, comprising:
a channel layer formed between a source layer and a drain layer; and
a semiconducting gate layer coupled to the channel layer, the semiconducting gate layer being formed with a layer of doped molybdenum disulfide ($MoS_2$).

14. The field-effect transistor of claim 13, wherein the semiconducting gate layer has a same carrier type as the channel layer.

15. The field-effect transistor of claim 14, wherein the semiconducting gate layer has a maximum effective gate voltage that is clamped to a depletion threshold of the semiconducting gate layer.

16. The field-effect transistor of claim 13, wherein the semiconducting gate is formed over the channel layer and wherein the field-effect transistor further comprises:

a gate dielectric layer or one or more barrier layers formed between the channel layer and the semiconducting gate.

17. The field-effect transistor of claim 13, further comprising:
a gate electrode comprising the gate layer, wherein the gate electrode is formed without overlying the channel layer, wherein the gate electrode is not capacitively coupled the channel layer, and wherein the gate electrode is electrically connected to the semiconducting gate layer.

18. The field-effect transistor of claim 17, further comprising:
a conducting gate layer electrically connected to the gate electrode through a portion of the semiconducting gate layer.

19. The field-effect transistor of claim 18, further comprising:
an extended portion of the channel layer that extends outside an area between the source layer and the drain layer, wherein the semiconducting gate layer further overlies the extended portion of the channel layer.

20. The field-effect transistor of claim 18, further comprising:
an extended portion of the channel layer that extends outside an area between the source layer and the drain layer but is physically separated from the channel layer, wherein the semiconducting gate layer further overlies the extended portion of the channel layer.

* * * * *